(12) United States Patent
Modi et al.

(10) Patent No.: US 9,466,757 B2
(45) Date of Patent: Oct. 11, 2016

(54) OPTICAL MATERIALS, OPTICAL COMPONENTS, DEVICES, AND METHODS

(75) Inventors: Rohit Modi, Waltham, MA (US); Patrick Landreman, Stanford, CA (US); John R. Linton, Concord, MA (US); Emily M. Squires, Littleton, MA (US)

(73) Assignee: QD VISION, INC., Lexington, MA (US)

( * ) Notice: Subject to any disclaimer, the term of this patent is extended or adjusted under 35 U.S.C. 154(b) by 0 days.

(21) Appl. No.: 13/283,399

(22) Filed: Oct. 27, 2011

(65) Prior Publication Data

US 2012/0189791 A1    Jul. 26, 2012

(51) Int. Cl.
| | |
|---|---|
| C09K 11/02 | (2006.01) |
| B32B 5/16 | (2006.01) |
| H01L 33/00 | (2010.01) |
| H01L 33/06 | (2010.01) |
| H01L 33/22 | (2010.01) |
| B82Y 10/00 | (2011.01) |
| H01L 33/10 | (2010.01) |
| H01L 33/20 | (2010.01) |
| G02B 5/20 | (2006.01) |

(52) U.S. Cl.
CPC ............ *H01L 33/005* (2013.01); *B82Y 10/00* (2013.01); *C09K 11/02* (2013.01); *H01L 33/06* (2013.01); *H01L 33/22* (2013.01); *G02B 5/206* (2013.01); *G02B 5/207* (2013.01); *H01L 33/105* (2013.01); *H01L 33/20* (2013.01); *Y10T 428/1317* (2015.01); *Y10T 428/25* (2015.01)

(58) Field of Classification Search
None
See application file for complete search history.

(56) References Cited

U.S. PATENT DOCUMENTS

| | | | |
|---|---|---|---|
| 4,075,037 A | 2/1978 | Taraneja et al. | |
| 4,201,598 A | 5/1980 | Tanaka et al. | |
| 5,557,436 A | 9/1996 | Blose et al. | |
| 6,048,616 A | 4/2000 | Gallagher et al. | |
| 6,322,901 B1 | 11/2001 | Bawendi et al. | |
| 6,447,698 B1 | 9/2002 | Ihara et al. | |
| 6,501,091 B1 | 12/2002 | Bawendi et al. | |
| 6,576,155 B1 | 6/2003 | Barbera-Guillem | |
| 6,576,291 B2 | 6/2003 | Bawendi et al. | |
| 6,613,247 B1 | 9/2003 | Hohn et al. | |
| 6,744,960 B2 | 6/2004 | Pelka | |
| 6,876,796 B2 | 4/2005 | Garito et al. | |
| 6,939,604 B1 | 9/2005 | Guyot-Sionnest et al. | |
| 7,091,653 B2 | 8/2006 | Ouderkirk et al. | |
| 7,144,131 B2 | 12/2006 | Rains | |
| 7,160,613 B2 | 1/2007 | Bawendi et al. | |
| 7,168,833 B2 | 1/2007 | Schottland et al. | |
| 7,227,177 B2 | 6/2007 | Guyot-Sionnest et al. | |
| 7,364,925 B2 | 4/2008 | Lee et al. | |
| 7,560,859 B2 | 7/2009 | Saito et al. | |
| 7,703,942 B2 | 4/2010 | Narendran et al. | |
| 7,723,744 B2 | 5/2010 | Gillies et al. | |
| 7,750,359 B2 | 7/2010 | Narendran et al. | |
| 7,772,551 B2 | 8/2010 | Todori et al. | |
| 7,837,348 B2 | 11/2010 | Narendran et al. | |
| 8,084,934 B2 | 12/2011 | Kim et al. | |
| 8,128,249 B2 | 3/2012 | Skipor et al. | |
| 8,405,063 B2 | 3/2013 | Kazlas et al. | |
| 8,642,977 B2 | 2/2014 | Comerford et al. | |
| 8,718,437 B2 | 5/2014 | Coe-Sullivan et al. | |
| 8,759,850 B2 | 6/2014 | Coe-Sullivan et al. | |
| 8,981,339 B2 | 3/2015 | Linton et al. | |
| 9,133,388 B2 | 9/2015 | Modi et al. | |
| 9,167,659 B2 | 10/2015 | Coe-Sullivan et al. | |
| 2002/0127224 A1 | 9/2002 | Chen | |
| 2003/0194731 A1 | 10/2003 | Sato et al. | |
| 2004/0110002 A1 | 6/2004 | Kim et al. | |
| 2004/0118448 A1 | 6/2004 | Scher et al. | |
| 2004/0151898 A1 | 8/2004 | Reiss et al. | |
| 2004/0245912 A1 | 12/2004 | Thurk et al. | |
| 2004/0262583 A1 | 12/2004 | Lee | |
| 2005/0058416 A1 | 3/2005 | Lee et al. | |
| 2005/0134723 A1 | 6/2005 | Lee et al. | |
| 2005/0135079 A1 | 6/2005 | Chua et al. | |
| 2005/0218377 A1 | 10/2005 | Lawandy | |
| 2005/0236556 A1 | 10/2005 | Sargent et al. | |
| 2005/0258418 A1 | 11/2005 | Steckel et al. | |
| 2005/0266246 A1 | 12/2005 | Reiss et al. | |
| 2006/0067602 A1 | 3/2006 | Todori et al. | |
| 2006/0081862 A1 | 4/2006 | Chua et al. | |
| 2006/0105481 A1 | 5/2006 | Boardman et al. | |
| 2006/0109682 A1 | 5/2006 | Ko et al. | |
| 2006/0174821 A1 | 8/2006 | Sato et al. | |
| 2006/0196375 A1 | 9/2006 | Coe-Sullivan et al. | |
| 2007/0045777 A1 | 3/2007 | Gillies et al. | |
| 2007/0138932 A1 | 6/2007 | Morioka et al. | |

(Continued)

FOREIGN PATENT DOCUMENTS

| | | |
|---|---|---|
| CN | 1629716 A | 6/2005 |
| JP | 09-050057 | 2/1997 |

(Continued)

OTHER PUBLICATIONS

U.S. Appl. No. 61/162,293, filed Mar. 21, 2009.*
Achermann, et al., "Multiexcitons confined within a subexcitonic volume; spectroscopic and dynamical signatures of neutral and charged biexcitons in ultrasmall semiconductor nanocrystals", Phys. Rev. B, vol. 68, No. 245302, pp. 1-5 (Dec. 31, 2003)
Asami, H., et al., "Photobrightening and Photodarkening in CdSe Nanocrystal/Polymer Thin Films", Intl. Jrnl. Of Nanoscience, vol. 1, Nos. 5&6, 2002, 641-644.
Asami, H., et al., "Surface State Analysis of Photobrightening in CdSe Nanocrystal Thin Films", J. Phys. Chem B 2003, 107, 12566-12568.
Bang, et al., "Quantum Dot Sensitized Solar Cells. A Tale of Two Semiconductor Nanocrystals: CdSe and CdTe", *ACS Nano*, vol. 3, No. 6, pp. 1467-1476 (2009).

(Continued)

*Primary Examiner* — Marie R. Yamnitzky

(57) ABSTRACT

An optical component including an optical material comprising quantum confined semiconductor nanoparticles, wherein the optical material has a solid state photoluminescent efficiency greater than or equal to 60%. Devices including optical materials and/or optical components and methods are also disclosed.

35 Claims, 2 Drawing Sheets

(56) References Cited

U.S. PATENT DOCUMENTS

| | | | |
|---|---|---|---|
| 2007/0246734 | A1 | 10/2007 | Lee et al. |
| 2007/0259206 | A1* | 11/2007 | Oshio ........................ 428/690 |
| 2008/0001167 | A1 | 1/2008 | Coe-Sullivan et al. |
| 2008/0029710 | A1 | 2/2008 | Sekiya et al. |
| 2008/0038558 | A1 | 2/2008 | Landry et al. |
| 2008/0173886 | A1 | 7/2008 | Cheon et al. |
| 2008/0188063 | A1 | 8/2008 | Alivisatos et al. |
| 2008/0237540 | A1 | 10/2008 | Dubrow |
| 2008/0258115 | A1 | 10/2008 | Ying et al. |
| 2008/0296534 | A1 | 12/2008 | Lifshitz et al. |
| 2009/0021148 | A1 | 1/2009 | Hachiya et al. |
| 2009/0162011 | A1 | 6/2009 | Coe-Sullivan et al. |
| 2009/0212695 | A1 | 8/2009 | Kim et al. |
| 2009/0280586 | A1 | 11/2009 | Coe-Sullivan |
| 2010/0051898 | A1 | 3/2010 | Kim et al. |
| 2010/0110728 | A1 | 5/2010 | Dubrow et al. |
| 2010/0155749 | A1 | 6/2010 | Chen et al. |
| 2010/0265307 | A1 | 10/2010 | Linton et al. |
| 2010/0283014 | A1 | 11/2010 | Breen et al. |
| 2010/0283036 | A1 | 11/2010 | Coe-Sullivan et al. |
| 2010/0283072 | A1 | 11/2010 | Kazlas et al. |
| 2010/0289044 | A1 | 11/2010 | Krames et al. |
| 2011/0031452 | A1 | 2/2011 | Krauss et al. |
| 2011/0068321 | A1 | 3/2011 | Pickett et al. |
| 2011/0068322 | A1 | 3/2011 | Pickett et al. |
| 2011/0103064 | A1* | 5/2011 | Coe-Sullivan et al. ...... 362/293 |
| 2011/0186811 | A1 | 8/2011 | Coe-Sullivan et al. |
| 2011/0199555 | A1 | 8/2011 | Coe-Sullivan et al. |
| 2011/0309325 | A1 | 12/2011 | Park et al. |
| 2012/0189791 | A1 | 7/2012 | Modi et al. |
| 2012/0313075 | A1 | 12/2012 | Linton et al. |
| 2013/0037778 | A1 | 2/2013 | Kazlas et al. |

FOREIGN PATENT DOCUMENTS

| | | |
|---|---|---|
| JP | 2005538573 | 12/2005 |
| KR | 10-2005-0061349 | 6/2005 |
| KR | 100724035 | 6/2007 |
| WO | WO0017655 A1 | 3/2000 |
| WO | WO2006005065 A2 | 1/2006 |
| WO | WO2006055456 A1 | 5/2006 |
| WO | WO2008063657 A2 | 5/2008 |
| WO | WO2008115498 A1 | 9/2008 |
| WO | WO2009002512 A1 | 12/2008 |
| WO | WO2009151515 A1 | 12/2009 |
| WO | WO2010129350 A2 | 11/2010 |
| WO | WO2010129350 A3 | 11/2010 |
| WO | WO2010129374 A2 | 11/2010 |
| WO | WO2010129374 A3 | 11/2010 |
| WO | WO2011060180 A1 | 5/2011 |

OTHER PUBLICATIONS

Carrillo-Carrion, C., et al., "Quantum Dots Luminescence Enhancement Due to Illumination With UV/Vis Light" ChemComm, 2009., pp. 5214-5226.

Cho, K., et al., "High-performance crosslinked colloidal quantum-dot light-emitting diodes", Nature Photonics, May 24, 2009., pp. 1-5.

Chon, J.W.M., et al., "Two-photon-induced photoenhancement of densely packed CdSe/ZnSe/ZnS Nanocrystal Solids and its Application to Multilayer Optical Data Storage", Applied Physics Letters, vol. 85, No. 23, Dec. 6, 2004, pp. 5514-5516.

Chinese Office Action (1st) mailed Sep. 24, 2013 in CN Application No. 201080028919.1, which is the Chinese counterpart of related U.S. Pat. No. 9133388., and English language translation.

Chinese Office Action (2nd) mailed Jul. 30, 2014 in copending CN Application No. 201080028919.1, which is the Chinese counterpart of related U.S. Pat. No. 9133388., and English language translation.

Chinese Office Action (3rd) mailed Mar. 23, 2015 in copending CN Application No. 201080028919.1, which is the Chinese counterpart of related U.S. Pat. No. 9133388., and English language translation.

Chinese Office Action (4th) mailed Oct. 10, 2015 in copending CN Application No. 201080028919.1, which is the Chinese counterpart of related U.S. Pat. No. 9133388., and English langauge translation.

Chinese Search Report mailed Sep. 24, 2013 in copending CN Application No. 201080028919.1, which is the Chinese counterpart of related U.S. Pat. No. 9133388., and English language translation.

Cordero, S.R., et al., "Photo-Activated Luminescence of CdSe Quantum Dot Monolayers", J. Phys. Chem. B 2000, 104, 12137-12142.

DeMello et al., "An Improved Experimental Determination of External Photoluminescence Quantum Efficiency", Advanced Materials 9(3):230, 1997.

Duncan, T., et al., "Improving the Quantum Yields of Semiconductor Quantum Dots Through Photoenhancement Assisted by Reducting Agents", The Journal of Physical Chemistry C, vol. 113, Apr. 10, 2009, pp. 7561-7566.

Farmer, S.C., et al., "Photoluminescent Polymer/Quantum Dot Composite Nanoparticles", Chem.Mater., 2001, 13 (11), pp. 3920-3926.

Firth, A.V., et al., "Optical properties of CdSe nanocrystals in a polymer matrix", Applied Physics Letters, vol. 75, No. 20, pp. 3120-3122, Nov. 15, 1999.

Gomonnai, A.V., et al., "X-Ray Excited Luminescence and X-ray Irradiation, Effect on $CdS_{1-x}Se_s$Nanocrystals Optical Absorption", vol. 3, No. 2, Jun. 2001, p. 509-514.

Guyot-Sionnest, P. "Reduced and Oxidized Colloid Quantum Dots" CNRS Seminar, Grenoble, FR, Sep. 2004 (48 pages).

Haase, et al., "Photochemistry and Radiation Chemistry of Colloidal Semiconductors. 23. Electron Storage on ZnO Particles and Size Quantization", *J. Phys. Chem.*, vol. 92, pp. 482-487 (1988).

Heath, et al. "Covalency in Semiconductor Quantum Dots", Chem. Soc. Rev., 1998, vol. 27, pp. 65-71.

Henglein, et al., "Photochemistry and Radiation Chemistry of Semiconductor Colloids: Reaction of the Hydrated Electron with CdS and Non-Linear Optical Effects", *Chem. Phys. Lett.*, vol. 132, No. 2, pp. 133-136 (1986).

Hengqun, et al., "Photoluminescence and Application of Non-linear Optical Property of nc-SiSiO2Films". Chinese Journal of Semiconductors, vol. 27, No. 2, pp. 345-348; Chinese (Feb. 28, 2006), and English language abstract.

Hess, B.C., et al., "Surface Transformation and Photoinduced Recovery in CdSe Nanocrystals", Physical Review Letters, vol. 86, No. 14., pp. 3132-3135, Apr. 2, 2001.

Jarosz, M.V., et al., "Photoconductivity studies of treated CdSe quantum dot films exhibiting increased exciton ionization efficiency", Phys. Rev. B 70, (2004), 195327.

Jha, P.P., "Trion Decay in Colloidal Quantum Dots", www.acsnano.org, AcNANO, vol. 3., No. 4,1011-1015, 2009.

Jones, M., et al., "Photoenhancement of Luminescence in Colloidal CdSe Quantum Dot Solutions", J. Phys. Chem. B, 2003 107, 11346-11352.

Japanese Office Action (1st) mailed Feb. 10, 2014 in JP Application No. 2012-508666, which is the Japanese counterpart of related U.S. Pat. No. 9133388., and English language translation.

Kim, D., et al., "Layer-by-Layer Assembly of Colloidal Cds and ZnS-CdS Quantum Dots and Improvement of Their Photoluminescence Properties", J. Phys. Chem, 2009, 113, 7015-7018.

Kim, K., et al., "Photoenhancement of a Quantum Dot Nanocomposite via UV Annealing and its Application to White LEDs", Advanced Materials, 23, 911-914, 2011.

Korsunska, N.E., et al., "Reversible and non-reversible photoenhanced luminescence in CdSe/ZnS quantum dots", Semicond. Sci. Technol. 20, Jul. 18, 2005, pp. 876-881.

Kumar, A., et al., "Features of gold having micrometer to centimeter dimensions can be formed through a combination of stamping with an elastomeric stamp and an alkanethiol 'ink 'followed by chemical etching", Applied Physics Letters, 63, 2002-2004, (1993).

Lee, S.F., et al., "Brightening, Blinking, Bluing and Bleaching in the Life of a Quantum Dot: Friend or Foe", ChemPhysChem, 2009, 10, 2174-2191.

(56) References Cited

OTHER PUBLICATIONS

Li, S., et al., "Surface States in the Photoionization of High-Quality CdSe Core/Shell Nanocrystals" *ACS Nano*(2009), vol. 3, No. 5, pp. 1267-1273. (Published on-line Apr. 17, 2009).
Liao, et al., "Blue luminescence from $Si_+$—implanted $SiO2$ films grown on crystalline silicon," Appl. Phys. Lett. 68(6), Feb. 5, 1996, pp. 850-852.
Liu, C., et al., "Temperature-dependent Brightening and Darkening of Photoluminescence from PbS Quantum Dots in Glasses", Appl. Phys. Lett. 90, 241111 (2007).
Lorenz, J.K., et al., "Surfactant-Semiconductor Interfaces: Perturbation of the Photoluminescence of Bulk Cadmium Selenide by Absorption of Tri- n- octylphosphine oxide as a probe of solution aggregation with relevance to nanocrystal stabilization", J. Am. Chem. Soc. 1998, 120, 10970-10975.
Miyoshi, T., et al., "Photodarkening and Photobrightening in Glasses Doped with CdS and CdSxSe1-x Nanocrystals", Jpn. J. Appl. Phys., vol. 39, No. 11, pp. 6290-6292. (2000).
Murase, N., et al., "Anomalous Photoluminescence in Silica-Coated Semiconductor Nanocrystals After Heat Treatment", Small-Journal, 2009, x, 1-4.
Murray et al., "Synthesis and Characterization of Nearly Monodisperse CdE (E=S, Se, Te) Semiconductor Nanocrystallites" (J. Am. Chem. Soc., 115:8706 (1993)).
Murray, C., Thesis of "Synthesis and Characterization of II-VI Quantum Dots and Their Assembly into 3-D Quantum Dot Superlattices", Massachusetts Institute of Technology, Sep. 1995. (166 pages)
Nayak, M. et al., (2008) "Passivation of CdTe Nanoparticles by Silane Coupling Agent Assisted Silica Encapsulation", in 26th Annual Conference on Composites, Advanced Ceramics, Materials, and Structures: B: Ceramic Engineering and Science Proceedings, vol. 23, Issue 4 (eds H.-T. Lin and M. Singh), John Wiley & Sons Inc., Hoboken, NJ USA (summary and bib data only—3 page printout).
Nazzal, A.Y., et al., "Environmental Effects on Photoluminescence of Highly Luminescent CdSe and CdSe/ZnS Core/Shell Nanocrystals in Polymer Thin Films", J. Phys. Chem. B. 2004, 108, 5507-5515.
Oda, M., et al., "Reversible photobluing of CdSe/ZnS/TOPO nanocrystals", *Colloids and Surfaces B: Biointerfaces (2007)*, vol. 56, pp. 241-245.
Oda, M., et al. "Photobrightening of CuBr Nanocrystals in PMMA", *J. Of Luminescence*, vol. 87-89 (2000), pp. 469-471.
Oda, M., et al., "Photoluminescence of CdSe/ZnS/TOPO nanocrystals expanded on silica glass substrates: Adsorption and desorption effects of polar molecules on nanocrystal surfaces," *J. Luminescence* 119-120, pp. 570-575 (2006).
Oda, M., et al., "Photobrightening of CdSe/ZnS/TOPO Nanocrystals", ScienceDirect, Jour. Of Luminescence 122-123 (2007) 762-765.
PCT International Search Report and Written Opinion mailed Jan. 25, 2011 for PCT/US2010/032799. PCT/US2010/032799 is the parent of this case.
PCT International Search Report and Written Opinion mailed Jan. 31, 2011, for PCT/US2010/032859 which is the parent application of related US Patent No. 9133388 B2.
Peterson, J.J., et al., "Photobrightening and photodarkening in PbS quantum dots", Phys. Chem. Chemical Physics, Jun. 20, 2006, vol. 8, pp. 3851-3856.

Polyakov, et al., "Some Aspects of Pulsed Laser Deposition of Si Nanocrystalline Films", The European Physical Journal Applied Physics, Sep. 2009, vol. 48, 20502, pp. 1-5.
Qin, G.G., "Extended Quantum Confinement/Luminescence Center Model For Photoluminescence From Oxidized Porous Silicon And Nanometer-Si-Particle- Or Nanometer-Ge-Particle-Embedded Silicon Oxide Films" *Mater. Res. Bulletin* (1998), vol. 33, No. 12, pp. 1857-1866.
Regelman, et al., "Optical Spectroscopy of Single quantum dots at tunable positive, neutral, and negative charge states", Phys. Rev. B, vol. 64, 165301 (2001) 1-7.
Rohwer, et al., "Development of solid state light source based on II-VI semiconductor quantum dots", Proc. Of SPIE, (2004), vol. 5366, pp. 66-74.
Santhanam, V., et al., "Microcontact Printing of Uniform Nanoparticle Arrays", *Nano Letters*, 4, 41-44, (2004).
Sharma, S.C., "A review of the elctro-optical properties and their modification by radiation in polymer-dispersed liquid crystals and thin films containing CdSe/ZnS quantum dots", materials Science & Enginering, 2010, pp. 5-15.
Shen, et al., "Assembly of CdS Quantum Dots onto Mesoscopic ti02 Films for Quantum Dot-Sensitized Solar Cell Applications", Resesarch Express @NCKU (online) 2008, vol. 5, Issue 7, pp. 1-9.
Shim, et al., "Doping and Charging in Colloidal Semiconductor Nanocrystals", MRS Bulletin/Dec. 2001, pp. 1005-10083
Shim, et al., "n-type Colloidal Semiconductor Nanocrystals", Nature, vol. 407, Oct. 26, 2000, pp. 981-983
Shim, et al., "Organic-Capped ZnO Nanocrystals: Synthesis and n-Type Character", J. Am. Chem. Soc., 2001, 123, 11651-11654.
Thoma, et al., "Encapsulation of Nanoparticles for the Manufacture of Solid State Lighting Devices", Proc. Of SPIE, (2004), vol. 5276, pp. 202-212.
Tsay, J.M., et al., "Enhancing the Photoluminescence of Peptide-Coated Nanocrystals with Shell Composition and UV Irradiation", J PHys Chem B. Feb. 10, 2005; 109(5): 1669-1674.
US Office Action in related U.S. Appl. No. 13/283,382 mailed Jul. 16, 2013 (now U.S. Pat. No. 9,133,388).
Venkatram, N.,et al., "$Au^{2+}$ion-beam irradiation effects on optical properties of CdSe and CdS quantum dots", Nuclear Instruments and Methods in Physics Research B, 266 (2008), pp. 1816-1819.
Wada, et al., "Photoinduced Film Formation of Colloidal CdSe Quantum Dots", *J. Phys. Chem. C*, vol. 112, pp. 17109-17114 (2008).
Wang, C., et al., "Light Emission and Amplification in Charged CdSe Quantum Dots", J. Phys. Chem. B, 2004, 108, 9027-9031.
Woo, et al., "Reversible Charging of CdSe Nanocrystals in a Simple Solid-State Device", Adv. Mater. 2002, 14, No. 15, pp. 1068-1071.
Xie, et al., "Synthesis and Characterization of Highly Luminescent CdSe—Core CdS/Zn0.5Cd0.5S/ZnS Multishell Nanocrystals", J. Am. Chem. Soc., 2005, 127, pp. 7480-7488.
Yuan, C.T. et al., "Photoinduced Fluorescence enhancement in colloidal CdSeTe/Zns core/shell quantum dots", Applied Physics Letters 92, 2008. pp. 183108-1-3.
Ziegler, Jan, "Ph/D/ thesis" Preparation and application of nanocrystals for white LEDs, Oct. 1, 2007, School of Chemical Sciences and Pharmacy, University of East Anglia, Norwich UK, Norwich, UK. (210 pages).
Extended European Search Report dated May 4, 2016 for European Patent Application No. 10772593.9 which is the European counterpart of related U.S. Pat. No. 9133388.
Korean Office Action mailed Feb. 18, 2016 in Korean Patent Application No. 10-20117028142, which is the Korean counterpart of related U.S. Pat. No. 9133388; and English language translation.

\* cited by examiner

OPTICAL MATERIALS, OPTICAL COMPONENTS, DEVICES, AND METHODS

This application is a continuation of commonly owned International Application No. PCT/US2010/032799 filed 28 Apr. 2010, which was published in the English language as PCT Publication No. WO 2010/129350 on 11 Nov. 2010, which International Application claims priority to U.S. Application No. 61/173,375 filed 28 Apr. 2009, U.S. Application No. 61/175,430 filed 4 May 2009, U.S. Application No. 61/175,456 filed 4 May 2009, U.S. Application No. 61/252,657 filed 17 Oct. 2009, and U.S. Application No. 61/252,749 filed 19 Oct. 2009; International Application No. PCT/US2010/032799 is also a continuation-in-part of International Application No. PCT/US2009/002789 filed 6 May 2009, which was published in the English language as PCT Publication No. WO 2009/151515 on 17 Dec. 2009. Each of the foregoing is hereby incorporated herein by reference in its entirety.

TECHNICAL FIELD OF THE INVENTION

The present invention relates to the technical field of optical materials including nanoparticles, devices and components including optical materials including nanoparticles, and methods.

SUMMARY OF THE INVENTION

The present invention also relates to an optical material comprising quantum confined semiconductor nanoparticles. The present invention also relates to methods for treating an optical material comprising quantum confined semiconductor nanoparticles. The present invention also relates to devices and components including an optical material taught herein. The present invention also relates to devices and components including an optical material treated by a method taught herein for treating an optical material. The present invention also relates to methods for improving the solid state photoluminescence efficiency or at least one performance stability property of an optical material. The present invention also relates to optical materials made by the methods taught herein.

The present invention also relates to an optical component including an optical material comprising quantum confined semiconductor nanoparticles. The present invention also relates to methods for treating an optical component including an optical material comprising quantum confined semiconductor nanoparticles. The present invention also relates to devices and components including an optical component taught herein. The present invention also relates to devices and components including an optical component treated by a method taught herein for treating an optical component. The present invention also relates to methods for improving the solid state photoluminescence efficiency or at least one performance stability property of an optical component. The present invention also relates to optical components made by the methods taught herein.

In accordance with one aspect of the present invention there is provided an optical material comprising quantum confined semiconductor nanoparticles, wherein the optical material has solid state photoluminescent quantum efficiency greater than or equal to 60%.

For example, the optical material can have solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

The optical material can further comprise light scatterers.

The optical material can further comprise other optional additives.

In accordance with another aspect of the present invention, there is provided an optical material comprising quantum confined semiconductor nanoparticles distributed in a host material, wherein the optical material has solid state photoluminescent quantum efficiency greater than or equal to the solution quantum efficiency of the quantum confined semiconductor nanoparticles prior to addition of the nanoparticles to the host material.

The optical material can further comprise a host material in which the nanoparticles are dispersed.

The optical material can further comprise light scatterers.

The optical material can further comprise other optional additives.

In accordance with another aspect of the present invention, there is provided an optical component including an optical material comprising quantum confined semiconductor nanoparticles, wherein the optical material has solid state photoluminescent quantum efficiency greater than or equal to 60%.

For example, the optical material can have a solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

The optical material can further comprise light scatterers.

The optical material can further comprise other optional additives.

In accordance with another aspect of the present invention, there is provided an optical component including an optical material comprising quantum confined semiconductor nanoparticles distributed in a host material, wherein the optical material has solid state photoluminescent quantum efficiency greater than or equal to the solution quantum efficiency of the quantum confined semiconductor nanoparticles prior to addition of the nanoparticles to the host material.

The optical material can further comprise light scatterers.

The optical material can further comprise other optional additives.

The optical component can include an optical material comprising quantum confined semiconductor nanoparticles distributed in a host material that is at least partially encapsulated.

Optical material can be partially encapsulated to various extents.

For example, more than 50% of the surface area of the optical material included in an optical component can be protected by one or more barrier materials.

The optical component can include an optical material comprising quantum confined semiconductor nanoparticles distributed in a host material that is fully encapsulated.

Preferably all of the surface area of the optical material included in an optical component is fully encapsulated.

In accordance with a further aspect of the present invention, there is provided a method for treating an optical material comprising quantum confined semiconductor nanoparticles. The method comprises exposing the optical material to a light flux and heat for a period of time sufficient to increase the solid state photoluminescent quantum efficiency of the optical material by at least 10% of its pre-exposure solid state photoluminescent quantum efficiency value.

The method can comprise exposing the optical material to light flux and heat for a period of time sufficient to increase solid state photoluminescent efficiency of the optical material by at least 20% of its pre-exposure solid state photoluminescent quantum efficiency value.

The method can comprise exposing the optical material to light flux and heat for a period of time sufficient to increase solid state photoluminescent efficiency of the optical material by at least 30% of its pre-exposure solid state photoluminescent quantum efficiency value.

The method can comprise exposing the optical material to light flux and heat for a period of time sufficient to increase solid state photoluminescent efficiency of the optical material by at least 40% of its pre-exposure solid state photoluminescent quantum efficiency value.

The method can comprise exposing the optical material to light flux and heat for a period of time sufficient to increase solid state photoluminescent efficiency of the optical material by at least 50% of its pre-exposure solid state photoluminescent quantum efficiency value.

The optical material can further comprise a host material in which the nanoparticles are dispersed.

The optical material can further comprise light scatterers.

The optical material can further comprise other optional additives.

The method can comprise exposing the optical material to light flux and heat for a period of time until the solid state photoluminescent efficiency increases to a substantially constant value.

The method can comprise exposing the optical material to light flux and heat at the same time.

The method can comprise exposing the optical material to heat during at least a portion of the time the optical material is exposed to light flux.

The method can comprise exposing the optical material to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical material to light flux and heat when the optical material is at least partially encapsulated.

Optical material can be partially encapsulated to various extents.

For example, more than 50% of the surface area of the optical material being treated can be protected by one or more barrier materials.

The method can further include exposing optical material to light flux and heat when the optical material is fully encapsulated.

Preferably all of the surface area of the optical material being treated is protected by one or more barrier materials.

The method can comprise exposing unencapsulated or partially encapsulated optical material to light flux and heat to achieve the desired result and fully encapsulating optical material following exposure to light flux and heat.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

Exposing the optical material to heat can comprise exposing the optical material to a temperature greater than 20° C.

Exposing the optical material to heat can comprise exposing the optical material to a temperature of at least 25° C.

Exposing the optical material to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

In a further aspect of the present invention, there is provided a method for treating an optical material comprising quantum confined semiconductor nanoparticles, the method comprising exposing the optical material to a light flux and heat for a period of time sufficient to achieve a solid state photoluminescent efficiency of the optical material greater than or equal to about 70%.

For example, the optical material can be exposed to light flux and heat for a period of time sufficient to achieve a solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

The optical material can further comprise light scatterers.

The optical material can further comprise other optional additives.

The method can comprise exposing the optical material to light flux and heat for a period of time until the solid state photoluminescent efficiency increases to a substantially constant value.

The method can comprise exposing the optical material to light flux and heat at the same time.

The method can comprise exposing the optical material to heat during at least a portion of the time the optical material is exposed to light flux.

The method can comprise exposing the optical material to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical material to light flux and heat when the optical material is at least partially encapsulated.

Optical material can be partially encapsulated to various extents.

For example, more than 50% of the surface area of the optical material being treated can be protected by one or more barrier materials.

The method can further include exposing optical material to light flux and heat when the optical material is fully encapsulated.

Preferably all of the surface area of the optical material being treated is protected by one or more barrier materials.

The method can comprise exposing unencapsulated or partially encapsulated optical material to light flux and heat to achieve the desired result and fully encapsulating optical material following exposure to light flux and heat.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

Exposing the optical material to heat can comprise exposing the optical material to a temperature greater than 20° C.

Exposing the optical material to heat can comprise exposing the optical material to a temperature of at least 25° C.

Exposing the optical material to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

In accordance with yet another aspect of the present invention, there is provided a method for treating an optical material comprising quantum confined semiconductor nanoparticles, the method comprising exposing at least partially encapsulated optical material to a light flux for a period of time sufficient to increase the solid state photoluminescent quantum efficiency of the optical material by at least 10% of its pre-exposure solid state photoluminescent quantum efficiency value.

The method can comprise exposing the at least partially encapsulated optical material to a light flux for a period of time sufficient to increase solid state photoluminescent efficiency of the optical material by at least 20% of its pre-exposure solid state photoluminescent quantum efficiency value.

The method can comprise exposing the at least partially encapsulated optical material to a light flux for a period of time sufficient to increase solid state photoluminescent efficiency of the optical material by at least 30% of its pre-exposure solid state photoluminescent quantum efficiency value.

The method can comprise exposing the at least partially encapsulated optical material to a light flux for a period of time sufficient to increase solid state photoluminescent efficiency of the optical material by at least 40% of its pre-exposure solid state photoluminescent quantum efficiency value.

The method can comprise exposing the at least partially encapsulated optical material to a light flux for a period of time sufficient to increase solid state photoluminescent efficiency of the optical material by at least 50% of its pre-exposure solid state photoluminescent quantum efficiency value.

Optical material can be partially encapsulated to various extents.

For example, more than 50% of the surface area of the optical material being treated can be protected by one or more barrier materials.

The method can further include exposing optical material to light flux when the optical material is fully encapsulated.

Preferably all of the surface area of the optical material being treated is protected by one or more barrier materials.

The method can comprise exposing the at least partially encapsulated optical material to a light flux for a period of time until the solid state photoluminescent efficiency increases to a substantially constant value.

The optical material can further comprise a host material in which the nanoparticles are dispersed.

The optical material can further comprise light scatterers.

The optical material can further comprise other optional additives.

The method can further comprise exposing the at least partially encapsulated optical material to a light flux and heat at the same time.

The method can comprise exposing the at least partially encapsulated optical material to heat during at least a portion of the time the optical material is exposed to light flux.

The method can comprise exposing the at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical material to light flux when the optical material is fully encapsulated.

The method can comprise exposing partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical material to heat, exposing to heat can comprise exposing the optical material to a temperature greater than 20° C.

If the method further includes exposing the optical material to heat, exposing to heat can comprise exposing the optical material to a temperature of at least 25° C.

If the method further includes exposing the optical material to heat, exposing to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

In accordance with yet another aspect of the present invention, there is provided a method for treating an optical material comprising quantum confined semiconductor nanoparticles, the method comprising exposing at least partially encapsulated optical material to a light flux for a period of time sufficient to achieve a solid state photoluminescent efficiency of the optical material greater than or equal to about 60%.

For example, the at least partially encapsulated optical material can be exposed to light flux for a period of time sufficient to achieve a solid state photoluminescent quantum efficiency greater than or equal to 65%, greater than 70%, greater than 75%, greater than 80%, greater than 85%, greater than 90%, etc.

Optical material can be partially encapsulated to various extents.

For example, more than 50% of the surface area of the optical material being treated can be protected by one or more barrier materials.

The method can further include exposing optical material to light flux when the optical material is fully encapsulated.

Preferably all of the surface area of the optical material being treated is protected by one or more barrier materials.

The optical material can further comprise a host material in which the nanoparticles are dispersed.

The optical material can further comprise light scatterers.

The optical material can further comprise other optional additives.

The method can comprise exposing the at least partially encapsulated optical material to a light flux for a period of time until the solid state photoluminescent efficiency increases to a substantially constant value.

The method can further comprise exposing the at least partially encapsulated optical material to a light flux and heat at the same time.

The method can comprise exposing the at least partially encapsulated optical material to heat during at least a portion of the time the optical material is exposed to light flux.

The method can comprise exposing the at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical material to light flux when the optical material is fully encapsulated.

The method can comprise exposing partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical material to heat, exposing to heat can comprise exposing the optical material to a temperature greater than 20° C.

If the method further includes exposing the optical material to heat, exposing to heat can comprise exposing the optical material to a temperature of at least 25° C.

If the method further includes exposing the optical material to heat, exposing to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

In accordance with a further aspect of the present invention, there is provided a method for improving at least one of solid state photoluminescent efficiency and a performance stability property of an optical material comprising quantum confined semiconductor nanoparticles, wherein the method comprises a method taught herein for treating an optical material.

In accordance with yet another aspect of the present invention, there is provided a method for treating an optical component including an optical material comprising quantum confined semiconductor nanoparticles, the method comprising exposing the optical component to a light flux and heat for a period of time sufficient to increase the solid state photoluminescent quantum efficiency of the optical material by at least 10% of its pre-exposure solid state photoluminescent quantum efficiency value.

The method can comprise exposing the optical component to light flux and heat for a period of time sufficient to increase solid state photoluminescent efficiency of the optical component by at least 20% of its pre-exposure solid state photoluminescent quantum efficiency value.

The method can comprise exposing the optical component to light flux and heat for a period of time sufficient to increase solid state photoluminescent efficiency of the optical component by at least 30% of its pre-exposure solid state photoluminescent quantum efficiency value.

The method can comprise exposing the optical component to light flux and heat for a period of time sufficient to increase solid state photoluminescent efficiency of the optical component by at least 40% of its pre-exposure solid state photoluminescent quantum efficiency value.

The method can comprise exposing the optical component to light flux and heat for a period of time sufficient to increase solid state photoluminescent efficiency of the optical component by at least 50% of its pre-exposure solid state photoluminescent quantum efficiency value.

The method can comprise exposing the optical component to light flux and heat for a period of time until the solid state photoluminescent efficiency increases to a substantially constant value.

The optical material can further comprise a host material in which the nanoparticles are dispersed.

The optical material can further comprise light scatterers.

The optical material can further comprise other optional additives.

The method can comprise exposing the optical component to light flux and heat at the same time.

The method can comprise exposing the optical component to heat during at least a portion of the time the optical material is exposed to light flux.

The method can comprise exposing the optical component to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing the optical component to light flux and heat wherein the optical material included in the optical component is at least partially encapsulated.

Optical material can be partially encapsulated to various extents.

For example, more than 50% of the surface area of the optical material included in an optical component being treated can be protected by one or more barrier materials.

The method can further include exposing an optical component to light flux and heat when the optical material included in the optical component is fully encapsulated.

Preferably all of the surface area of the optical material included in an optical component being treated is protected by one or more barrier materials.

The method can comprise exposing an optical component including unencapsulated or partially encapsulated optical material to light flux and heat to achieve the desired result and fully encapsulating optical material in the optical component following exposure to light flux and heat.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

Exposing the optical component to heat can comprise exposing the optical component to a temperature greater than 20° C.

Exposing the optical component to heat can comprise exposing the optical component to a temperature of at least 25° C.

Exposing the optical component to heat can comprise exposing the optical component to a temperature in a range from about 25° to about 80° C.

The optical component can include an optical material that can further comprise a host material in which the nanoparticles are distributed.

The method can provide stabilized the color attributes of photoluminescent emission from the treated optical material.

The method can provide stabilized peak emission wavelength of photoluminescent emission from the treated optical component.

In yet another aspect of the present invention, there is provided a method for treating an optical component including an optical material comprising quantum confined semiconductor nanoparticles. The method comprises exposing the optical component to a light flux and heat for a period of time sufficient to achieve a solid state photoluminescent efficiency of the optical material greater than or equal to about 60%.

For example, the optical component can be exposed to light flux and heat for a period of time sufficient to achieve a solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

The optical material can further comprise light scatterers.

The optical material can further comprise other optional additives.

The method can comprise exposing the optical component to light flux and heat for a period of time until the solid state photoluminescent efficiency increases to a substantially constant value.

The optical material can further comprise a host material in which the nanoparticles are dispersed.

The optical material can further comprise light scatterers.

The optical material can further comprise other optional additives.

The method can comprise exposing the optical component to light flux and heat at the same time.

The method can comprise exposing the optical component to heat during at least a portion of the time the optical material is exposed to light flux.

The method can comprise exposing the optical component to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing the optical component to light flux and heat wherein the optical material included in the optical component is at least partially encapsulated.

Optical material can be partially encapsulated to various extents.

For example, more than 50% of the surface area of the optical material included in an optical component being treated can be protected by one or more barrier materials.

The method can further include exposing an optical component to light flux and heat when the optical material included in the optical component is fully encapsulated.

Preferably all of the surface area of the optical material included in an optical component being treated is protected by one or more barrier materials.

The method can comprise exposing an optical component including unencapsulated or partially encapsulated optical material to light flux and heat to achieve the desired result and fully encapsulating optical material in the optical component following exposure to light flux and heat.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

Exposing the optical component to heat can comprise exposing the optical component to a temperature greater than 20° C.

Exposing the optical component to heat can comprise exposing the optical component to a temperature of at least 25° C.

Exposing the optical component to heat can comprise exposing the optical component to a temperature in a range from about 25° to about 80° C.

The optical component can include an optical material that can further comprise a host material in which the nanoparticles are distributed.

The method can provide stabilized the color attributes of photoluminescent emission from the treated optical material.

The method can provide stabilized peak emission wavelength of photoluminescent emission from the treated optical component.

In accordance with a still further aspect of the present invention, there is provided a method for treating an optical component including an optical material comprising quantum confined semiconductor nanoparticles, the method comprising exposing an optical component including at least partially encapsulated optical material to a light flux for a period of time sufficient to increase the solid state photoluminescent quantum efficiency of the optical material by at least 10% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 20% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 30% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 40% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 50% of its pre-exposure solid state photoluminescent quantum efficiency value.

The method can comprise exposing the optical component including at least partially encapsulated optical material to a light flux for a period of time until the solid state photoluminescent efficiency increases to a substantially constant value.

Optical material can be partially encapsulated to various extents.

For example, more than 50% of the surface area of the optical material included in an optical component being treated can be protected by one or more barrier materials.

The method can further include exposing an optical component to light flux when the optical material is fully encapsulated.

Preferably all of the surface area of the optical material included in an optical component being treated is protected by one or more barrier materials.

The optical material can further comprise a host material in which the nanoparticles are dispersed.

The optical material can further comprise light scatterers.

The optical material can further comprise other optional additives.

The method can comprise exposing the optical component including at least partially encapsulated optical material to a light flux for a period of time until the solid state photoluminescent efficiency increases to a substantially constant value.

The method can further comprise exposing the optical component including at least partially encapsulated optical material to a light flux and heat at the same time.

The method can comprise exposing the optical component including at least partially encapsulated optical material to heat during at least a portion of the time the optical material is exposed to light flux.

The method can comprise exposing the optical component including at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical component including optical material to light flux when the optical material is fully encapsulated.

The method can comprise exposing optical component including partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical component to heat, exposing to heat can comprise exposing the optical component to a temperature greater than 20° C.

If the method further includes exposing the optical component to heat, exposing to heat can comprise exposing the optical component to a temperature of at least 25° C.

If the method further includes exposing the optical component to heat, exposing to heat can comprise exposing the optical component to a temperature in a range from about 25° to about 80° C.

The method can provide stabilized the color attributes of photoluminescent emission from the treated optical component.

The method can provide stabilized peak emission wavelength of photoluminescent emission from the treated optical component.

In accordance with a further aspect of the present invention, there is provided a method for treating an optical component including an optical material comprising quantum confined semiconductor nanoparticles, the method comprising exposing the optical component including at least partially encapsulated optical material to a light flux for a period of time sufficient to achieve a solid state photoluminescent efficiency of the optical material greater than or equal to about 60%.

For example, the optical component including at least partially encapsulated optical material can be exposed to light flux for a period of time sufficient to achieve a solid state photoluminescent quantum efficiency greater than or equal to 65%, greater than 70%, greater than 75%, greater than 80%, greater than 85%, greater than 90%, etc.

The method can comprise exposing the optical component including at least partially encapsulated optical material to a light flux for a period of time until the solid state photoluminescent efficiency increases to a substantially constant value.

Optical material can be partially encapsulated to various extents.

For example, more than 50% of the surface area of the optical material included in an optical component being treated can be protected by one or more barrier materials.

The method can further include exposing an optical component to light flux when the optical material is fully encapsulated.

Preferably all of the surface area of the optical material included in an optical component being treated is protected by one or more barrier materials.

The optical material can further comprise a host material in which the nanoparticles are dispersed.

The optical material can further comprise light scatterers.

The optical material can further comprise other optional additives.

The method can comprise exposing the optical component including at least partially encapsulated optical material to a light flux for a period of time until the solid state photoluminescent efficiency increases to a substantially constant value.

The method can further comprise exposing the optical component including at least partially encapsulated optical material to a light flux and heat at the same time.

The method can comprise exposing the optical component including at least partially encapsulated optical material to heat during at least a portion of the time the optical material is exposed to light flux.

The method can comprise exposing the optical component including at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical component including optical material to light flux when the optical material is fully encapsulated.

The method can comprise exposing optical component including partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical component to heat, exposing to heat can comprise exposing the optical component to a temperature greater than 20° C.

If the method further includes exposing the optical component to heat, exposing to heat can comprise exposing the optical component to a temperature of at least 25° C.

If the method further includes exposing the optical component to heat, exposing to heat can comprise exposing the optical component to a temperature in a range from about 25° to about 80° C.

The method can provide stabilized the color attributes of photoluminescent emission from the treated optical component.

The method can provide stabilized peak emission wavelength of photoluminescent emission from the treated optical component.

In accordance with a further aspect of the present invention, there is provided a method for improving at least one of solid state photoluminescent efficiency and a performance stability property of an optical component including an optical material comprising quantum confined semiconductor nanoparticles, wherein the method comprises a method taught herein for treating an optical component.

In accordance with another aspect of the present invention, there is provided a device including an optical material taught herein.

In accordance with another aspect of the present invention, there is provided a device including an optical component taught herein.

In accordance with another aspect of the present invention, there is provided a method for improving the solid state photoluminescent efficiency of an optical material comprising quantum confined semiconductor nanocrystals wherein the optical material has been previously handled in an atmosphere that includes oxygen (e.g., but not limited to, air). The method comprises exposing the previously handled optical material comprising quantum confined semiconductor nanocrystals to light flux for a period of time sufficient to increase the solid state photoluminescent efficiency thereof, wherein the optical material is partially encapsulated during the exposure step.

The method can be carried out in an atmosphere that includes oxygen.

The method can be carried out in an inert atmosphere.

The method can be carried out in a nitrogen atmosphere.

The light flux can comprise a peak wavelength in a range from about 365 nm to about 480 nm.

The light flux can comprise a peak wavelength in a range from about 365 nm to about 470 nm.

The light flux can comprise a peak wavelength that is less than the bandgap of the nanoparticles.

The light flux can be in a range from about 10 to about 100 mW/cm$^2$.

Optical material can be partially encapsulated to various extents.

For example, more than 50% of the surface area of the optical material being treated can be protected by one or more barrier materials.

The method can further include exposing optical material to light flux when the optical material is fully encapsulated.

Preferably all of the surface area of the optical material being treated is protected by one or more barrier materials.

The method can further include exposing the optical material to heat at least a portion of the time the optical component is exposed to light flux.

The method can further include exposing the optical material to heat during the total time the optical component is exposed to light flux.

Exposing the optical material to heat can comprise heating the optical material at a temperature greater than 20° C.

An optical material can comprise quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

The method can further include fully encapsulating a partially encapsulated optical material following exposure to light flux and heat. Such encapsulation step can be carried out in an oxygen free environment.

Preferably, the optical material is fully encapsulated while being exposed to light flux.

The optical material can be at least partially or fully encapsulated by one or more barrier materials.

A barrier material can comprise a material that is a barrier to oxygen.

A barrier material can comprise a material that is a barrier to oxygen and water.

An optical material can be included in an optical component or other device when exposed to light flux.

An optical material can be treated while included in an optical component.

In accordance with another aspect of the invention, there is provided an optical material and an optical component treated by a method taught herein.

As used herein, "encapsulation" refers to protection against oxygen. In certain embodiments, encapsulation can be complete (also referred to herein as full encapsulation or fully encapsulated). In certain embodiments, encapsulation can be less than complete (also referred to herein as partial encapsulation or partially encapsulated).

As used herein, "barrier material" refers to a material that provides protection against at least oxygen.

As used herein, "solid state external quantum efficiency that does not change by more than X %" (wherein X=5, 10, 20, 30, 40) is determined from measurements made on an item at the beginning of a 60 day period and after it has been stored in air for the following 60 days at 20° C. under fluorescent room light. In other words, the value of the solid state external quantum efficiency does not change by more than X % of the value of the solid state external quantum efficiency measured at the beginning of the 60 day period. As used in the foregoing definition, "fluorescent room light" refers to general illumination light of about 5000 lumens that is provided by one or more fluorescent lamps.

As used herein, "solid state external quantum efficiency" (also referred to herein as "EQE" or "solid state photoluminescent efficiency) is measured in a 12" integrating sphere using a NIST traceable calibrated light source, using the method developed by Mello et al., Advanced Materials 9(3):230 (1997), which is hereby incorporated by reference.

The foregoing, and other aspects and embodiments described herein all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

It is to be understood that both the foregoing general description and the following detailed description are exemplary and explanatory only and are not restrictive of the invention as claimed. Other embodiments will be apparent to those skilled in the art from consideration of the specification and practice of the invention disclosed herein.

Figure 1:
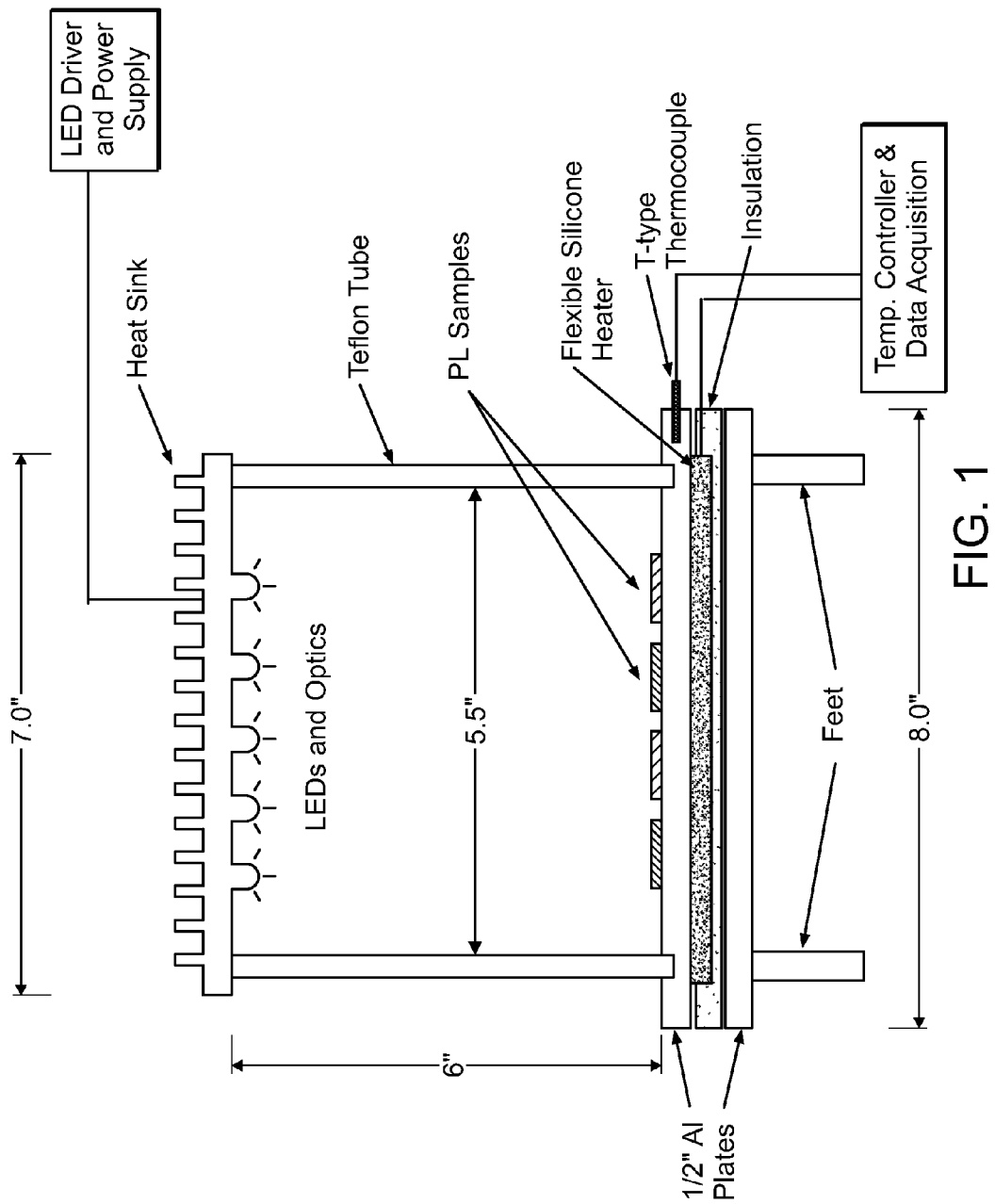
FIG. 1 depicts a schematic of a non-limiting example of an arrangement that can be used with methods described herein.

The attached figures are simplified representations presented for purposes of illustration only; the actual structures may differ in numerous respects, particularly including the relative scale of the articles depicted and aspects thereof.

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

In accordance with one aspect of the present invention there is provided an optical material comprising quantum confined semiconductor nanoparticles, wherein the optical material has solid state photoluminescent quantum efficiency greater than or equal to 60%.

For example, the optical material can have a solid state photoluminescent quantum efficiency greater than or equal to 65%, greater than 70%, greater than 75%, greater than 80%, greater than 85%, greater than 90%, etc.

An optical material can include at least one type of quantum confined semiconductor nanoparticle with respect to chemical composition, structure, and size. The type(s) of quantum confined semiconductor nanoparticles included in an optical material can be determined by the wavelength of light to be converted and the wavelengths of the desired light output. As discussed herein, quantum confined semiconductor nanoparticles may or may not include a shell and/or a ligand on a surface thereof. A shell and/or ligand can passivate quantum confined semiconductor nanoparticles to prevent agglomeration or aggregation to overcome the Van der Waals binding force between the nanoparticles. As discussed herein, a shell can comprise an inorganic shell.

Two or more different type of quantum confined semiconductor nanoparticles (based on composition, structure and/or size) may be included in an optical material, wherein each type is selected to obtain light having a predetermined color.

An optical material can include one or more different types of quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

An optical material can comprise quantum confined semiconductor nanoparticles distributed in a host material.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

An optical material including light scatterers can include an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

An optical material in accordance with the invention can have a solid state photoluminescent efficiency that does not change by more than 40% upon exposure to air for 60 days at 20° C. under fluorescent room light.

An optical material in accordance with the invention can have a solid state photoluminescent efficiency of the material that does not change by more than 30% upon exposure to air for 60 days at 20° C. under fluorescent room light.

An optical material in accordance with the invention can have a solid state photoluminescent efficiency of the material that does not change by more than 20% upon exposure to air for 60 days at 20° C. under fluorescent room light.

An optical material in accordance with the invention can have a solid state photoluminescent efficiency of the material that does not change by more than 10% upon exposure to air for 60 days at 20° C. under fluorescent room light.

An optical material in accordance with the invention can have a solid state photoluminescent efficiency of the material that does not change by more than 5% upon exposure to air for 60 days at 20° C. under fluorescent room light.

In accordance with another aspect of the present inventions, there is provided an optical material comprising quantum confined semiconductor nanoparticles distributed in a host material, wherein the optical material has solid state photoluminescent quantum efficiency greater than or equal to the solution quantum efficiency of the quantum confined semiconductor nanoparticles prior to addition of the nanoparticles to the host material.

An optical material can include at least one type of quantum confined semiconductor nanoparticle with respect to chemical composition, structure, and size. The type(s) of quantum confined semiconductor nanoparticles included in an optical material can be determined by the wavelength of light to be converted and the wavelengths of the desired light output. As discussed herein, quantum confined semiconductor nanoparticles may or may not include a shell and/or a ligand on a surface thereof. A shell and/or ligand can passivate quantum confined semiconductor nanoparticles to prevent agglomeration or aggregation to overcome the Van der Waals binding force between the nanoparticles. As discussed herein, a shell can comprise an inorganic shell.

Two or more different type of quantum confined semiconductor nanoparticles (based on composition, structure and/or size) may be included in an optical material, wherein each type is selected to obtain light having a predetermined color.

An optical material can include one or more different types of quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

An optical material can comprise quantum confined semiconductor nanoparticles distributed in a host material.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

An optical material including light scatterers can include an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

An optical material in accordance with the invention can have a solid state photoluminescent efficiency that does not change by more than 40% upon exposure to air for 60 days at 20° C. under fluorescent room light.

An optical material in accordance with the invention can have a solid state photoluminescent efficiency of the material that does not change by more than 30% upon exposure to air for 60 days at 20° C. under fluorescent room light.

An optical material in accordance with the invention can have a solid state photoluminescent efficiency of the material that does not change by more than 20% upon exposure to air for 60 days at 20° C. under fluorescent room light.

An optical material in accordance with the invention can have a solid state photoluminescent efficiency of the material that does not change by more than 10% upon exposure to air for 60 days at 20° C. under fluorescent room light.

An optical material in accordance with the invention can have a solid state photoluminescent efficiency of the material that does not change by more than 5% upon exposure to air for 60 days at 20° C. under fluorescent room light.

In accordance with another aspect of the present invention, there is provided an optical component including an optical material comprising quantum confined semiconductor nanoparticles, wherein the optical material has solid state photoluminescent quantum efficiency greater than or equal to 60%.

For example, the optical material can have solid state photoluminescent quantum efficiency greater than or equal to 65%, greater than 70%, greater than 75%, greater than 80%, greater than 85%, greater than 90%, etc.

An optical material included in the optical component can include at least one type of quantum confined semiconductor nanoparticle with respect to chemical composition, structure, and size. The type(s) of quantum confined semiconductor nanoparticles included in an optical material can be determined by the wavelength of light to be converted and the wavelengths of the desired light output. As discussed herein, quantum confined semiconductor nanoparticles may or may not include a shell and/or a ligand on a surface thereof. A shell and/or ligand can passivate quantum confined semiconductor nanoparticles to prevent agglomeration or aggregation to overcome the Van der Waals binding force between the nanoparticles. As discussed herein, a shell can comprise an inorganic shell.

Two or more different type of quantum confined semiconductor nanoparticles (based on composition, structure and/or size) may be included in an optical material included in an optical component, wherein each type is selected to obtain light having a predetermined color.

An optical material can include one or more different types of quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

An optical material can comprise quantum confined semiconductor nanoparticles dispersed or distributed in a host material.

Examples of host materials include polymers, resins, silicones, and glass. Other examples of host materials are provided below.

An optical material including a host material can include up to about 30 weight percent quantum confined semiconductor nanoparticles based on the weight of the host material An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

An optical component in accordance with the invention can include an optical material having a solid state photoluminescent efficiency that does not change by more than 40% upon exposure to air for 60 days at 20° C. under fluorescent room light.

An optical component in accordance with the invention can include an optical material having a solid state photoluminescent efficiency that does not change by more than 30% upon exposure to air for 60 days at 20° C. under fluorescent room light.

An optical component in accordance with the invention can include an optical material having a solid state photoluminescent efficiency that does not change by more than 20% upon exposure to air for 60 days at 20° C. under fluorescent room light.

An optical component in accordance with the invention can include an optical material having a solid state photoluminescent efficiency that does not change by more than 10% upon exposure to air for 60 days at 20° C. under fluorescent room light.

An optical component in accordance with the invention can include an optical material having a solid state photoluminescent efficiency that does not change by more than 5% upon exposure to air for 60 days at 20° C. under fluorescent room light.

An optical component in accordance with the invention can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

An optical material can be disposed on a surface of a structural member.

An optical material can be disposed within a structural member.

For example, an optical material can be included in a cavity or hollow portion that may be included in a structural member, e.g., but not limited to, a tube-like structural member, which can have any shape cross-section.

The configuration and dimensions of an optical component can be selected based on the intended end-use application and design.

An optical component can include an optical material that is at least partially encapsulated.

An optical component can include an optical material that is at least partially encapsulated by one or more barrier materials.

Optical material can be partially encapsulated to various extents.

For example, more than 50% of the surface area of the optical material included in the optical component can be protected by one or more barrier materials.

A barrier material may be in the form of a structural member designed and configured based on the intended end-use application for the optical component including same.

For example, an optical component can comprise an optical material that is at least partially encapsulated between opposing structural members, wherein each of the structural members comprises one or more barrier materials, which can be the same or different.

For example, an optical component can comprise an optical material that is at least partially encapsulated between a structural member and a coating or layer, wherein each of the structural member and coating or layer comprise one or more barrier materials, which can be the same or different.

A barrier material can be substantially oxygen impervious.

A barrier material can be substantially water impervious.

A barrier material can be substantially oxygen and water impervious.

A barrier material can also be a structural member.

In another example, an optical component can comprise an optical material included within a structural member. For example, an optical material can be included in a hollow or cavity portion of a tubular-like structural member (e.g., a tube, hollow capillary, hollow fiber, etc.) that can be open at either or both ends.

Other designs, configurations, and combinations of barrier materials and/or structural members comprising barrier materials can be included in an optical component in which the optical material is at least partially encapsulated. Such designs, configurations, and combinations can be selected based on the intended end-use application and design.

Barrier material included in an optical component can be optically transparent to permit light to pass into and/or out of optical material that it may encapsulate.

Depending on the design of an optical component, a barrier material and/or a structural member that is optically transparent may be included in a preselected region of the optical component to permit light to pass into and/or out of such region. Such preselected region can be a predetermined area of the of the optical component or the entire component, based on the design and intended end-use application.

Examples of transparent materials that can serve as barrier materials and/or structural members, include, but are not limited to, e.g., glass, polycarbonate, hardcoated polyester, acrylic, other known materials that are impervious to preselected environmental factors, (e.g., oxygen and/or moisture).

A barrier material and/or structural member can be flexible (e.g. but not limited to thin acrylic, epoxy, polycarbonate, PEN, PET, PE).

A barrier material can be a composite, consisting of multiple layers of different components, or coatings on a substrate.

A barrier material and/or structural member can be rigid (e.g. but not limited to glass, thick acrylic, thick transparent polymers, may be a composite or coated with layers (e.g. $SiO_x$) to improve barrier properties)

A barrier material and/or a structural member can have surface that is smooth or roughened.

A barrier material and/or a structural member can have a thickness that is substantially uniform.

As mentioned above, an optical component can include an optical material that is fully encapsulated.

For example, an optical component can include an optical material that is fully encapsulated by a barrier material or structural member or by a combination of two or more barrier materials and/or structural members.

Preferably all of the surface area of the optical material included in an optical component is protected by one or more barrier materials.

An optical component including an optical material that is fully encapsulated by one or more barrier materials and/or structural member s can further include a seal to join such materials and/or structural members together. A seal can comprise a material that also blocks the passage of oxygen and moisture.

For example, an optical component can include an optical material that is encapsulated between opposing barrier materials that are sealed together by another barrier material or sealant. An example of this arrangement includes an optical material that is fully encapsulated between opposing substrates (e.g., glass plates) that are sealed together by a seal.

A seal can comprise a layer of barrier material that covers the optical material, wherein the optical material and barrier material arrangement is sandwiched between the glass plates that are sealed together by the layer of barrier material.

A seal can comprise an edge or perimeter seal.

The seal can comprise an edge or perimeter seal.

A seal can comprise barrier material.

A seal can comprise an oxygen barrier.

A seal can comprise a water barrier.

A seal can comprise an oxygen and water barrier.

A seal can be substantially impervious to water and/or oxygen.

An optical material can be disposed on a substrate (e.g., but not limited to, a glass plate) and completely sealed by a barrier material that can block the passage or oxygen and water.

Non-limiting examples of materials that can be used to form an edge or perimeter seal include a glass-to-glass seal, a glass-to-metal seal, or other barrier material with sealant properties.

In another example, an optical component can comprise an optical material included in a tubular structural member (e.g., a tube, hollow capillary, hollow fiber, etc.) that can be sealed both ends.

It will be appreciated that other designs, configurations, and combinations of barrier materials and/or structural members comprising barrier materials can be included in an optical component in which the optical material is fully encapsulated. Such designs, configurations, and combinations can be selected based on the intended end-use application and design.

An optical component can include an optical material that is fully encapsulated by materials that are substantially oxygen impervious can be preferred.

In accordance with another aspect of the present invention, there is provided an optical component including an optical material comprising quantum confined semiconductor nanoparticles distributed in a host material, wherein the optical material has solid state photoluminescent quantum efficiency greater than or equal to the solution quantum efficiency of the quantum confined semiconductor nanoparticles prior to addition of the nanoparticles to the host material.

An optical material included in the optical component can include at least one type of quantum confined semiconductor nanoparticle with respect to chemical composition, structure, and size. The type(s) of quantum confined semiconductor nanoparticles included in an optical material can be determined by the wavelength of light to be converted and the wavelengths of the desired light output. As discussed herein, quantum confined semiconductor nanoparticles may or may not include a shell and/or a ligand on a surface thereof. A shell and/or ligand can passivate quantum confined semiconductor nanoparticles to prevent agglomeration or aggregation to overcome the Van der Waals binding force between the nanoparticles. As discussed herein, a shell can comprise an inorganic shell.

Two or more different type of quantum confined semiconductor nanoparticles (based on composition, structure and/or size) may be included in an optical material included in an optical component, wherein each type is selected to obtain light having a predetermined color.

An optical material can include one or more different types of quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

Examples of host materials include polymers, resins, silicones, and glass. Other examples of host materials are provided below.

An optical material including a host material can include up to about 30 weight percent quantum confined semiconductor nanoparticles based on the weight of the host material An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

An optical component in accordance with the invention can include an optical material having a solid state photoluminescent efficiency that does not change by more than 40% upon exposure to air for 60 days at 20° C. under fluorescent room light.

An optical component in accordance with the invention can include an optical material having a solid state photoluminescent efficiency that does not change by more than 30% upon exposure to air for 60 days at 20° C. under fluorescent room light.

An optical component in accordance with the invention can include an optical material having a solid state photoluminescent efficiency that does not change by more than 20% upon exposure to air for 60 days at 20° C. under fluorescent room light.

An optical component in accordance with the invention can include an optical material having a solid state photoluminescent efficiency that does not change by more than 10% upon exposure to air for 60 days at 20° C. under fluorescent room light.

An optical component in accordance with the invention can include an optical material having a solid state photoluminescent efficiency that does not change by more than 5% upon exposure to air for 60 days at 20° C. under fluorescent room light.

An optical component in accordance with the invention can further include a structural member that supports or contains the optical material. Such structural member can have a variety of different shapes or configurations. For example, it can be planar, curved, convex, concave, hollow, linear, circular, square, rectangular, oval, spherical, cylindrical, or any other shape or configuration that is appropriate based on the intended end-use application and design. An example of a common structural components is a substrates such as a plate-like member.

An optical material can be disposed on a surface of a structural member.

An optical material can be disposed within a structural member.

For example, an optical material can be included in a cavity or hollow portion that may be included in a structural member, e.g., but not limited to, a tube-like structural member, which can have any shape cross-section.

The dimension of an optical component can be selected based on the intended end-use application and design.

An optical component can include an optical material that is at least partially encapsulated.

An optical component can include an optical material that is at least partially encapsulated by one or more barrier materials.

Optical material can be partially encapsulated to various extents.

For example, more than 50% of the surface area of the optical material included in an optical component can be protected by one or more barrier materials.

A structural member can comprise a barrier material.

A barrier material may be in the form of a structural member designed and configured based on the intended end-use application for the optical component including same.

For example, an optical component can comprise an optical material that is at least partially encapsulated between opposing substrates, wherein each of the substrates comprises one or more barrier materials, which can be the same or different.

For example, an optical component can comprise an optical material that is at least partially encapsulated between opposing structural members, wherein each of the structural members comprises one or more barrier materials, which can be the same or different.

For example, an optical component can comprise an optical material that is at least partially encapsulated between a structural member and a coating or layer, wherein each of the structural member and coating or layer comprise one or more barrier materials, which can be the same or different.

A barrier material can be substantially oxygen impervious.

A barrier material can be substantially water impervious.

A barrier material can be substantially oxygen and water impervious.

A barrier material can also be a structural member.

In another example, an optical component can comprise an optical material included within a structural member. For example, an optical material can be included in a hollow or cavity portion of a tubular-like structural member (e.g., a tube, hollow capillary, hollow fiber, etc.) that can be open at either or both ends.

Other designs, configurations, and combinations of barrier materials and/or structural members comprising barrier materials can be included in an optical component in which the optical material is at least partially encapsulated. Such designs, configurations, and combinations can be selected based on the intended end-use application and design.

Barrier material included in an optical component can be optically transparent to permit light to pass into and/or out of optical material that it may encapsulate.

Depending on the design of an optical component, a barrier material and/or a structural member that is optically transparent may be included in a preselected region of the optical component to permit light to pass into and/or out of such region. Such preselected region can be a predetermined area of the of the optical component or the entire component, based on the design and intended end-use application.

Examples of transparent materials that can serve as barrier materials and/or structural members, include, but are not limited to, e.g., glass, polycarbonate, hardcoated polyester, acrylic, other known materials that are impervious to preselected environmental factors, (e.g., oxygen and/or moisture).

A barrier material and/or structural member can be flexible (e.g. but not limited to thin acrylic, epoxy, polycarbonate, PEN, PET, PE).

A barrier material can be a composite, consisting of multiple layers of different components, or coatings on a substrate.

A barrier material and/or structural member can be rigid (e.g. but not limited to glass, thick acrylic, thick transparent polymers, may be a composite or coated with layers (e.g. $SiO_x$) to improve barrier properties.

A barrier material and/or a structural member can have surface that is smooth or roughened.

A barrier material and/or a structural member can have a thickness that is substantially uniform.

As mentioned above, an optical component can include an optical material that is fully encapsulated.

Preferably all of the surface area of the optical material included in an optical component is protected by one or more barrier materials.

For example, an optical component can include an optical material that is fully encapsulated by a barrier material or structural member or by a combination of two or more barrier materials and/or structural members.

An optical component including an optical material that is fully encapsulated by one or more barrier materials and/or structural member s can further include a seal to join such materials and/or structural members together. A seal can comprise a material that also blocks the passage of oxygen and moisture.

For example, an optical component can include an optical material that is encapsulated between opposing barrier materials that are sealed together by another barrier material or sealant. An example of this arrangement includes an optical material that is fully encapsulated between opposing substrates (e.g., glass plates) that are sealed together by a seal.

A seal can comprise a layer of barrier material that covers the optical material, wherein the optical material and barrier material arrangement is sandwiched between the glass plates that are sealed together by the layer of barrier material.

A seal can comprise an edge or perimeter seal.

The seal can comprise an edge or perimeter seal.

A seal can comprise barrier material.

A seal can comprise an oxygen barrier.

A seal can comprise a water barrier.

A seal can comprise an oxygen and water barrier.

A seal can be substantially impervious to water and/or oxygen.

An optical material can be disposed on a substrate (e.g., a glass plate) and completely sealed by a barrier material that can block the passage or oxygen and water.

Non-limiting examples of materials that can be used to form an edge or perimeter seal include a glass-to-glass seal, a glass-to-metal seal, or other barrier material with sealant properties.

In another example, an optical component can comprise an optical material included in a tubular structural member (e.g., a tube, hollow capillary, hollow fiber, etc.) that can be sealed both ends.

It will be appreciated that other designs, configurations, and combinations of barrier materials and/or structural members comprising barrier materials can be included in an optical component in which the optical material is fully encapsulated. Such designs, configurations, and combinations can be selected based on the intended end-use application and design.

An optical component including an optical material that is fully encapsulated by materials that are substantially oxygen impervious can be preferred.

In accordance with another aspect of the present invention, there is provided a method for treating an optical material comprising quantum confined semiconductor nanoparticles, the method comprising exposing the optical material to a light flux and heat for a period of time sufficient to increase the solid state photoluminescent quantum efficiency of the optical material by at least 10% of its pre-exposure solid state photoluminescent quantum efficiency value.

The method can comprise exposing the optical material to light flux and heat for a period of time sufficient to increase solid state photoluminescent efficiency of the optical material by at least 20% of its pre-exposure solid state photoluminescent quantum efficiency value.

The method can comprise exposing the optical material to light flux and heat for a period of time sufficient to increase solid state photoluminescent efficiency of the optical material by at least 30% of its pre-exposure solid state photoluminescent quantum efficiency value.

The method can comprise exposing the optical material to light flux and heat for a period of time sufficient to increase solid state photoluminescent efficiency of the optical material by at least 40% of its pre-exposure solid state photoluminescent quantum efficiency value.

The method can comprise exposing the optical material to light flux and heat for a period of time sufficient to increase solid state photoluminescent efficiency of the optical material by at least 50% of its pre-exposure solid state photoluminescent quantum efficiency value.

The optical material can further comprise a host material in which the nanoparticles are dispersed.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

The method can comprise exposing the optical material to light flux and heat for a period of time until the solid state photoluminescent efficiency increases to a substantially constant value.

The method can comprise exposing the optical material to light flux and heat at the same time.

The method can comprise exposing the optical material to heat during at least a portion of the time the optical material is exposed to light flux.

The method can comprise exposing the optical material to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical material to light flux and heat when the optical material is at least partially encapsulated.

Optical material can be partially encapsulated to various extents.

For example, more than 50% of the surface area of the optical material being treated can be protected by one or more barrier materials.

An optical material can be at least partially encapsulated by one or more barrier materials. Examples of barrier materials and combinations of barrier materials are described elsewhere herein.

The method can comprise an optical material is at least partially encapsulated by including the optical material on a barrier material (e.g., a glass substrate) and including a coating over at least a portion of a surface of the optical material opposite the barrier material.

The method can comprise an optical material is at least partially encapsulated by sandwiching the optical material between barrier materials (e.g., glass plates and/or other types of substrates.

The method can comprise exposing unencapsulated or partially encapsulated optical material to light flux and heat to achieve the desired result and fully encapsulating optical material following exposure to light flux and heat.

The method can further include exposing optical material to light flux and heat when the optical material is fully encapsulated.

An optical material can be fully encapsulated by one or more barrier materials.

Preferably all of the surface area of the optical material being treated is protected by one or more barrier materials The method can comprise an optical material that is encapsulated between opposing substrates that are sealed together by a seal, wherein each of the substrates and seal are substantially oxygen impervious.

The method can comprise an optical material that is encapsulated between opposing substrates are sealed together by a seal, wherein each of the substrates and seal are substantially water impervious.

The method can comprise an optical material that is encapsulated between opposing substrates are sealed together by a seal, wherein each of the substrates and seal are substantially oxygen and water impervious.

The method can comprise an optical material that is disposed on a substrate and the optical material is covered by a coating comprising a barrier material.

The method can comprise a barrier material comprising a material that is substantially oxygen impervious.

The method can comprise a barrier material that is substantially water impervious.

The method can comprise a barrier material that is substantially oxygen and water impervious.

A substrate that may be used in a method in accordance with the invention can comprise one or more barrier materials.

A substrate that may be used in a method in accordance with the invention can comprise glass. Other barrier materials are described herein.

The method can comprise an optical material is encapsulated between glass plates that are sealed together by barrier material.

The method can comprise an optical material that is encapsulated between glass plates that are sealed together by a glass-to-glass perimeter or edge seal.

The method can comprise an optical material is encapsulated between glass plates that are sealed together by a glass-to-metal perimeter or edge seal.

The method can comprise an optical material that is encapsulated between glass plates that are sealed together by an epoxy or other sealant with barrier material properties.

An optical material can be exposed to light flux by irradiating the optical material with light from a light source having the desired peak wavelength and intensity.

The light flux can comprise a peak wavelength in a range from about 365 nm to about 480 nm.

The light flux can comprise a peak wavelength in a range from about 365 nm to about 470 nm.

The light flux can comprise peak wavelength in a range from about 450 nm to about 470 nm.

The light flux can have a center wavelength less than the bandgap of the quantum confined semiconductor nanoparticles included in the optical material included in the optical component.

Light flux can be provided by a light source comprising a light source with peak wavelength that is less than the bandgap of the optical material.

Light flux can be provided by a light source comprising an LED light source with peak wavelength in a range from about 365 nm to about 480 nm.

Light flux can be provided by a light source comprising an LED light source with peak wavelength in a range from about 365 nm to about 470 nm.

Light flux can be provided by a light source comprising an LED light source with peak wavelength in a range from about 450 nm to about 470 nm.

Light flux can be provided by a light source comprising a fluorescent lamp that emits light with a wavelength in a range from about 365 nm to about 480 nm.

Light flux can be provided by a light source comprising a fluorescent lamp that emits light with a wavelength in a range from about 365 nm to about 470 nm.

Light flux can be provided by a light source comprising a fluorescent lamp that emits light with a wavelength in a range from about 450 nm to about 470 nm.

The light flux can be in a range from about 10 to about 100 mW/cm$^2$.

The light flux can be in a range from about 30 to about 50 mW/cm2.

The light flux can be in a range from about 20 to about 35 mW/cm2,

The light flux can be in a range from about 20 to about 30 mW/cm2.

Other types of light sources that can emit light at the desired wavelength and with the desired intensity can also be used.

Preferably, the light flux to which the optical material is exposed is uniform.

Exposing the optical material to heat can comprise exposing the optical material to a temperature greater than 20° C.

Exposing the optical material to heat can comprise exposing the optical material to a temperature of at least 25° C.

Exposing the optical material to heat can comprise exposing the optical material to a temperature in a range from about 25° to about 80° C.

Preferably, the temperature does not exceed a temperature which is detrimental to the performance of the optical material or any encapsulation material.

The method can provide stabilized the color attributes of photoluminescent emission from the treated optical material.

The method can provide stabilized peak emission wavelength of photoluminescent emission from the treated optical material.

Other information provided herein may also be useful in practicing the above method.

In accordance with another aspect of the present invention, there is provided a method for treating an optical material comprising quantum confined semiconductor nanoparticles, the method comprising exposing the optical material to a light flux and heat for a period of time sufficient to achieve a solid state photoluminescent efficiency of the optical material greater than or equal to about 60%.

For example, the optical material can have solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

The method can comprise exposing the optical material to light flux and heat for a period of time until the solid state photoluminescent efficiency increases to a substantially constant value.

The method can comprise exposing the optical material to light flux and heat at the same time.

The method can comprise exposing the optical material to heat during at least a portion of the time the optical material is exposed to light flux.

The method can comprise exposing the optical material to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical material to light flux and heat when the optical material is at least partially encapsulated.

Optical material can be partially encapsulated to various extents.

For example, more than 50% of the surface area of the optical material being treated can be protected by one or more barrier materials An optical material can be at least partially encapsulated by one or more barrier materials. Examples of barrier materials and combinations of barrier materials are described elsewhere herein.

The method can comprise an optical material is at least partially encapsulated by including the optical material on a barrier material (e.g., a glass substrate) and including a coating over at least a portion of a surface of the optical material opposite the barrier material.

The method can comprise an optical material is at least partially encapsulated by sandwiching the optical material between barrier materials (e.g., glass plates and/or other types of substrates).

The method can comprise exposing unencapsulated or partially encapsulated optical material to light flux and heat to achieve the desired result and fully encapsulating optical material following exposure to light flux and heat.

The method can further include exposing optical material to light flux and heat when the optical material is fully encapsulated.

Preferably all of the surface area of the optical material being treated is protected by one or more barrier materials.

An optical material can be fully encapsulated by one or more barrier materials.

The method can comprise an optical material that is encapsulated between opposing substrates that are sealed together by a seal, wherein each of the substrates and seal are substantially oxygen impervious.

The method can comprise an optical material that is encapsulated between opposing substrates are sealed together by a seal, wherein each of the substrates and seal are substantially water impervious.

The method can comprise an optical material that is encapsulated between opposing substrates are sealed together by a seal, wherein each of the substrates and seal are substantially oxygen and water impervious.

The method can comprise an optical material that is disposed on a substrate and the optical material is covered by a coating comprising a barrier material.

The method can comprise a barrier material comprising a material that is substantially oxygen impervious.

The method can comprise a barrier material that is substantially water impervious.

The method can comprise a barrier material that is substantially oxygen and water impervious.

A substrate that may be used in a method in accordance with the invention can comprise one or more barrier materials.

A substrate that may be used in a method in accordance with the invention can comprise glass. Other barrier materials are described herein.

The method can comprise an optical material is encapsulated between glass plates that are sealed together by barrier material.

The method can comprise an optical material that is encapsulated between glass plates that are sealed together by a glass-to-glass perimeter or edge seal.

The method can comprise an optical material is encapsulated between glass plates that are sealed together by a glass-to-metal perimeter or edge seal.

The method can comprise an optical material that is encapsulated between glass plates that are sealed together by an epoxy or other sealant with barrier material properties.

An optical material can be exposed to light flux by irradiating the optical material with light from a light source having the desired peak wavelength and intensity.

The light flux can comprise a peak wavelength in a range from about 365 nm to about 480 nm.

The light flux can comprise a peak wavelength in a range from about 365 nm to about 470 nm.

The light flux can comprise peak wavelength in a range from about 450 nm to about 470 nm.

The light flux can have a center wavelength less than the bandgap of the quantum confined semiconductor nanoparticles included in the optical material included in the optical component.

Light flux can be provided by a light source comprising a light source with peak wavelength that is less than the bandgap of the optical material.

Light flux can be provided by a light source comprising an LED light source with peak wavelength in a range from about 365 nm to about 480 nm.

Light flux can be provided by a light source comprising an LED light source with peak wavelength in a range from about 365 nm to about 470 nm.

Light flux can be provided by a light source comprising an LED light source with peak wavelength in a range from about 450 nm to about 470 nm.

Light flux can be provided by a light source comprising a fluorescent lamp that emits light with a wavelength in a range from about 365 nm to about 480 nm.

Light flux can be provided by a light source comprising a fluorescent lamp that emits light with a wavelength in a range from about 365 nm to about 470 nm.

Light flux can be provided by a light source comprising a fluorescent lamp that emits light with a wavelength in a range from about 450 nm to about 470 nm.

The light flux can be in a range from about 10 to about 100 mW/cm$^2$.

The light flux can be in a range from about 30 to about 50 mW/cm2.

The light flux can be in a range from about 20 to about 35 mW/cm2,

The light flux can be in a range from about 20 to about 30 mW/cm2.

Other types of light sources that can emit light at the desired wavelength and with the desired intensity can also be used.

Preferably, the light flux to which the optical material is exposed is uniform.

Exposing the optical material to heat can comprise exposing the optical material to a temperature greater than 20° C.

Exposing the optical material to heat can comprise exposing the optical material to a temperature of at least 25° C.

Exposing the optical material to heat can comprise exposing the optical material to a temperature in a range from about 25° to about 80° C.

Preferably, the temperature does not exceed a temperature which is detrimental to the performance of the optical material or any encapsulation material.

The method can provide stabilized the color attributes of photoluminescent emission from the treated optical material.

The method can provide stabilized peak emission wavelength of photoluminescent emission from the treated optical material.

Other information provided herein may also be useful in practicing the above method.

In accordance with yet another aspect of the present invention, there is provided a method for treating an optical material comprising quantum confined semiconductor nanoparticles, the method comprising exposing at least partially encapsulated optical material to a light flux for a period of time sufficient to increase the solid state photoluminescent quantum efficiency of the optical material by at least 10% of its pre-exposure solid state photoluminescent quantum efficiency value.

The method can comprise exposing the at least partially encapsulated optical material to a light flux for a period of time sufficient to increase solid state photoluminescent efficiency of the optical material by at least 20% of its pre-exposure solid state photoluminescent quantum efficiency value.

The method can comprise exposing the at least partially encapsulated optical material to a light flux for a period of time sufficient to increase solid state photoluminescent efficiency of the optical material by at least 30% of its pre-exposure solid state photoluminescent quantum efficiency value.

The method can comprise exposing the at least partially encapsulated optical material to a light flux for a period of time sufficient to increase solid state photoluminescent efficiency of the optical material by at least 40% of its pre-exposure solid state photoluminescent quantum efficiency value.

The method can comprise exposing the at least partially encapsulated optical material to a light flux for a period of time sufficient to increase solid state photoluminescent efficiency of the optical material by at least 50% of its pre-exposure solid state photoluminescent quantum efficiency value.

The method can comprise exposing the at least partially encapsulated optical material to a light flux for a period of time until the solid state photoluminescent efficiency increases to a substantially constant value.

Optical material can be partially encapsulated to various extents.

For example, more than 50% of the surface area of the optical material being treated can be protected by one or more barrier materials.

The method can further include exposing optical material to light flux when the optical material is fully encapsulated.

Preferably all of the surface area of the optical material being treated is protected by one or more barrier materials.

In certain preferred embodiments, the optical material is fully encapsulated.

The optical material can further comprise a host material in which the nanoparticles are dispersed.

The optical material can further comprise light scatterers.

The optical material can further comprise other optional additives.

The method can further comprise exposing the at least partially encapsulated optical material to a light flux and heat at the same time.

The method can comprise exposing the at least partially encapsulated optical material to heat during at least a portion of the time the optical material is exposed to light flux.

The method can comprise exposing the at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical material to light flux when the optical material is fully encapsulated.

The method can comprise exposing partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical material to heat, exposing to heat can comprise exposing the optical material to a temperature greater than 20° C.

If the method further includes exposing the optical material to heat, exposing to heat can comprise exposing the optical material to a temperature of at least 25° C.

If the method further includes exposing the optical material to heat, exposing to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

Other information provided herein may also be useful in practicing the above method.

In accordance with yet another aspect of the present invention, there is provided a method for treating an optical material comprising quantum confined semiconductor nanoparticles, the method comprising exposing at least partially encapsulated optical material to a light flux for a period of time sufficient to achieve a solid state photoluminescent efficiency of the optical material greater than or equal to about 60%.

For example, the at least partially encapsulated optical material can be exposed to light flux for a period of time sufficient to achieve a solid state photoluminescent quantum efficiency greater than or equal to 65%, greater than 70%, greater than 75%, greater than 80%, greater than 85%, greater than 90%, etc.

Optical material can be partially encapsulated to various extents.

For example, more than 50% of the surface area of the optical material being treated can be protected by one or The method can further include exposing optical material to light flux when the optical material is fully encapsulated.

Preferably all of the surface area of the optical material being treated is protected by one or more barrier materials.

Other information provided herein can also be useful with the above method.

The optical material can further comprise a host material in which the nanoparticles are dispersed.

The optical material can further comprise light scatterers.

The optical material can further comprise other optional additives.

The method can comprise exposing the at least partially encapsulated optical material to a light flux for a period of time until the solid state photoluminescent efficiency increases to a substantially constant value.

The method can further comprise exposing the at least partially encapsulated optical material to a light flux and heat at the same time.

The method can comprise exposing the at least partially encapsulated optical material to heat during at least a portion of the time the optical material is exposed to light flux.

The method can comprise exposing the at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical material to light flux when the optical material is fully encapsulated.

The method can comprise exposing partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical material to heat, exposing to heat can comprise exposing the optical material to a temperature greater than 20° C.

If the method further includes exposing the optical material to heat, exposing to heat can comprise exposing the optical material to a temperature of at least 25° C.

If the method further includes exposing the optical material to heat, exposing to heat can comprise exposing the optical material to a temperature in a range from about 25° to about 80° C.

The optical material can further comprise a host material in which the nanoparticles are distributed.

The method can provide stabilized the color attributes of photoluminescent emission from the treated optical material.

The method can provide stabilized peak emission wavelength of photoluminescent emission from the treated optical material.

Other information provided herein may also be useful in practicing the above method.

In accordance with a further aspect of the present invention, there is provided a method for improving at least one of solid state photoluminescent efficiency and a performance stability property of an optical material comprising quantum confined semiconductor nanoparticles, wherein the method comprises a method taught herein for treating an optical material.

Other information provided herein may also be useful in practicing the above method.

An optical material treated in accordance with methods for treating an optical material disclosed herein can have a solid state photoluminescent efficiency that does not change by more than 40% upon exposure to air for 60 days at 20° C. under fluorescent room light.

An optical material treated in accordance with the invention can have a solid state photoluminescent efficiency of the material that does not change by more than 30% upon exposure to air for 60 days at 20° C. under fluorescent room light.

An optical material treated in accordance with the invention can have a solid state photoluminescent efficiency of the material that does not change by more than 20% upon exposure to air for 60 days at 20° C. under fluorescent room light.

An optical material treated in accordance with the invention can have a solid state photoluminescent efficiency of the material that does not change by more than 10% upon exposure to air for 60 days at 20° C. under fluorescent room light.

An optical material treated in accordance with the invention can have a solid state photoluminescent efficiency of the material that does not change by more than 5% upon exposure to air for 60 days at 20° C. under fluorescent room light.

In accordance with another aspect of the present invention, there is provided a method for treating an optical component including an optical material comprising quantum confined semiconductor nanoparticles, the method comprising exposing the optical component to a light flux and heat for a period of time sufficient to increase the solid state photoluminescent quantum efficiency of the optical material by at least 10% of its pre-exposure solid state photoluminescent quantum efficiency value.

The method can comprise exposing the optical component to light flux and heat for a period of time sufficient to increase solid state photoluminescent efficiency of the optical component by at least 20% of its pre-exposure solid state photoluminescent quantum efficiency value.

The method can comprise exposing the optical component to light flux and heat for a period of time sufficient to increase solid state photoluminescent efficiency of the optical component by at least 30% of its pre-exposure solid state photoluminescent quantum efficiency value.

The method can comprise exposing the optical component to light flux and heat for a period of time sufficient to increase solid state photoluminescent efficiency of the optical component by at least 40% of its pre-exposure solid state photoluminescent quantum efficiency value.

The method can comprise exposing the optical component to light flux and heat for a period of time sufficient to increase solid state photoluminescent efficiency of the optical component by at least 50% of its pre-exposure solid state photoluminescent quantum efficiency value.

The method can comprise exposing the optical component to light flux and heat for a period of time until the solid state photoluminescent efficiency increases to a substantially constant value.

The optical material can further comprise a host material in which the nanoparticles are dispersed.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

The method can comprise exposing the optical component to light flux and heat at the same time.

The method can comprise exposing the optical component to heat during at least a portion of the time the optical material is exposed to light flux.

The method can comprise exposing the optical component to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical component to light flux and heat when the optical material is at least partially encapsulated.

Optical material can be partially encapsulated to various extents.

For example, more than 50% of the surface area of the optical material included in an optical component being treated can be protected by one or more barrier materials.

An optical material can be at least partially encapsulated by one or more barrier materials. Examples of barrier materials and combinations of barrier materials are described elsewhere herein.

The method can comprise an optical component including an optical material is at least partially encapsulated by including the optical material on a barrier material (e.g., a glass substrate) and including a coating over at least a portion of a surface of the optical material opposite the barrier material.

The method can comprise an optical component including an optical material is at least partially encapsulated by sandwiching the optical material between barrier materials (e.g., glass plates and/or other types of substrates).

The method can comprise exposing an optical component including unencapsulated or partially encapsulated optical material to light flux and heat to achieve the desired result and fully encapsulating optical material following exposure to light flux and heat.

The method can further include exposing an optical component to light flux and heat when the optical material is fully encapsulated.

An optical material can be fully encapsulated by one or more barrier materials.

Preferably all of the surface area of the optical material included in an optical component being treated is protected by one or more barrier materials.

The method can comprise an optical component including an optical material that is encapsulated between opposing substrates that are sealed together by a seal, wherein each of the substrates and seal are substantially oxygen impervious.

The method can comprise an optical component including an optical material that is encapsulated between opposing substrates are sealed together by a seal, wherein each of the substrates and seal are substantially water impervious.

The method can comprise an optical component including an optical material that is encapsulated between opposing substrates are sealed together by a seal, wherein each of the substrates and seal are substantially oxygen and water impervious.

The method can comprise an optical component including an optical material that is disposed on a substrate and the optical material is covered by a coating comprising a barrier material.

The method can comprise a barrier material comprising a material that is substantially oxygen impervious.

The method can comprise a barrier material that is substantially water impervious.

The method can comprise a barrier material that is substantially oxygen and water impervious.

A substrate that may be used in a method in accordance with the invention can comprise one or more barrier materials.

A substrate that may be used in a method in accordance with the invention can comprise glass. Other barrier materials are described herein.

The method can comprise an optical material is encapsulated between glass plates that are sealed together by barrier material.

The method can comprise an optical component including an optical material that is encapsulated between glass plates that are sealed together by a glass-to-glass perimeter or edge seal.

The method can comprise an optical component including an optical material is encapsulated between glass plates that are sealed together by a glass-to-metal perimeter or edge seal.

The method can comprise an optical component including an optical material that is encapsulated between glass plates that are sealed together by an epoxy or other sealant with barrier material properties.

An optical component including optical material can be exposed to light flux by irradiating the optical material with light from a light source having the desired peak wavelength and intensity.

The light flux can comprise a peak wavelength in a range from about 365 nm to about 480 nm.

The light flux can comprise a peak wavelength in a range from about 365 nm to about 470 nm.

The light flux can comprise peak wavelength in a range from about 450 nm to about 470 nm.

The light flux can have a center wavelength less than the bandgap of the quantum confined semiconductor nanoparticles included in the optical material included in the optical component.

Light flux can be provided by a light source comprising a light source with peak wavelength that is less than the bandgap of the optical material.

Light flux can be provided by a light source comprising an LED light source with peak wavelength in a range from about 365 nm to about 480 nm.

Light flux can be provided by a light source comprising an LED light source with peak wavelength in a range from about 365 nm to about 470 nm.

Light flux can be provided by a light source comprising an LED light source with peak wavelength in a range from about 450 nm to about 470 nm.

Light flux can be provided by a light source comprising a fluorescent lamp that emits light with a wavelength in a range from about 365 nm to about 480 nm.

Light flux can be provided by a light source comprising a fluorescent lamp that emits light with a wavelength in a range from about 365 nm to about 470 nm.

Light flux can be provided by a light source comprising a fluorescent lamp that emits light with a wavelength in a range from about 450 nm to about 470 nm.

The light flux can be in a range from about 10 to about 100 mW/cm$^2$.

The light flux can be in a range from about 30 to about 50 mW/cm2.

The light flux can be in a range from about 20 to about 35 mW/cm2,

The light flux can be in a range from about 20 to about 30 mW/cm2.

Other types of light sources that can emit light at the desired wavelength and with the desired intensity can also be used.

Preferably, the light flux to which the optical material is exposed is uniform.

Exposing an optical component including optical material to heat can comprise exposing the optical material to a temperature greater than 20° C.

Exposing an optical component including optical material to heat can comprise exposing the optical material to a temperature of at least 25° C.

Exposing an optical component including optical material to heat can comprise exposing the optical material to a temperature in a range from about 25° to about 80° C.

Preferably, the temperature does not exceed a temperature which is detrimental to the performance of the optical material or any encapsulation material.

The method can provide stabilized the color attributes of photoluminescent emission from the treated an optical component including optical material.

The method can provide stabilized peak emission wavelength of photoluminescent emission from the treated an optical component including optical material.

Other information provided herein may also be useful in practicing the above method.

In accordance with another aspect of the present invention, there is provided a method for treating an optical component including an optical material comprising quantum confined semiconductor nanoparticles, the method comprising exposing the optical component to a light flux and heat for a period of time sufficient to achieve a solid state photoluminescent efficiency of the optical material greater than or equal to about 60%.

For example, the optical component can be exposed to light flux and heat for a period of time sufficient to achieve a solid state photoluminescent quantum efficiency greater than or equal to 65%, greater than 70%, greater than 75%, greater than 80%, greater than 85%, greater than 90%, etc.

The optical material can further comprise a host material in which the nanoparticles are dispersed.

Examples of host materials include polymers, resins, silicones, and glass. Other examples of host materials are provided below.

An optical material including a host material can include up to about 30 weight percent quantum confined semiconductor nanoparticles based on the weight of the host material.

An optical material can further comprise light scatterers. Additional information concerning light scatterers is provided below.

The amount of light scatterers can be determined based on the particular optical component and its intended end-use application. An optical material including light scatterers can include, for example, an amount of light scatterers in a range from 0.01 weight percent based on the weight of the host material up to an amount that is the same as the amount of quantum confined semiconductor nanoparticles included in the optical material. Other amounts of light scatterers can be included.

An optical material can further comprise other optional additives.

Examples of other optional additives can include, but are not limited to, e.g., wetting or leveling agents).

The method can comprise exposing the optical component to light flux and heat at the same time.

The method can comprise exposing the optical component to heat during at least a portion of the time the optical material is exposed to light flux.

The method can comprise exposing the optical component to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can further include exposing optical component to light flux and heat when the optical material is at least partially encapsulated.

Optical material can be partially encapsulated to various extents.

For example, more than 50% of the surface area of the optical material included in an optical component being treated can be protected by one or more barrier materials.

An optical material can be at least partially encapsulated by one or more barrier materials. Examples of barrier materials and combinations of barrier materials are described elsewhere herein.

The method can comprise an optical component including an optical material is at least partially encapsulated by including the optical material on a barrier material (e.g., a glass substrate) and including a coating over at least a portion of a surface of the optical material opposite the barrier material.

The method can comprise an optical component including an optical material is at least partially encapsulated by sandwiching the optical material between barrier materials (e.g., glass plates and/or other types of substrates).

The method can comprise exposing an optical component including unencapsulated or partially encapsulated optical material to light flux and heat to achieve the desired result and fully encapsulating optical material following exposure to light flux and heat. Such full encapsulation step can be carried out in a oxygen free environment. Such full encapsulation step can be carried out in a oxygen and water free environment.

The method can further include exposing an optical component to light flux and heat when the optical material is fully encapsulated.

An optical material can be fully encapsulated by one or more barrier materials.

Preferably all of the surface area of the optical material included in an optical component being treated is protected by one or more barrier materials.

The method can comprise an optical component including an optical material that is encapsulated between opposing substrates that are sealed together by a seal, wherein each of the substrates and seal are substantially oxygen impervious.

The method can comprise an optical component including an optical material that is encapsulated between opposing substrates are sealed together by a seal, wherein each of the substrates and seal are substantially water impervious.

The method can comprise an optical component including an optical material that is encapsulated between opposing substrates are sealed together by a seal, wherein each of the substrates and seal are substantially oxygen and water impervious.

The method can comprise an optical component including an optical material that is disposed on a substrate and the optical material is covered by a coating comprising a barrier material.

The method can comprise a barrier material comprising a material that is substantially oxygen impervious.

The method can comprise a barrier material that is substantially water impervious.

The method can comprise a barrier material that is substantially oxygen and water impervious.

A substrate that may be used in a method in accordance with the invention can comprise one or more barrier materials.

A substrate that may be used in a method in accordance with the invention can comprise glass. Other barrier materials are described herein.

The method can comprise an optical material is encapsulated between glass plates that are sealed together by barrier material.

The method can comprise an optical component including an optical material that is encapsulated between glass plates that are sealed together by a glass-to-glass perimeter or edge seal.

The method can comprise an optical component including an optical material is encapsulated between glass plates that are sealed together by a glass-to-metal perimeter or edge seal.

The method can comprise an optical component including an optical material that is encapsulated between glass plates that are sealed together by an epoxy or other sealant with barrier material properties.

An optical component including optical material can be exposed to light flux by irradiating the optical material with light from a light source having the desired peak wavelength and intensity.

The light flux can comprise a peak wavelength in a range from about 365 nm to about 480 nm.

The light flux can comprise a peak wavelength in a range from about 365 nm to about 470 nm.

The light flux can comprise peak wavelength in a range from about 450 nm to about 470 nm.

The light flux can have a center wavelength less than the bandgap of the quantum confined semiconductor nanoparticles included in the optical material included in the optical component.

Light flux can be provided by a light source comprising a light source with peak wavelength that is less than the bandgap of the optical material.

Light flux can be provided by a light source comprising an LED light source with peak wavelength in a range from about 365 nm to about 480 nm.

Light flux can be provided by a light source comprising an LED light source with peak wavelength in a range from about 365 nm to about 470 nm.

Light flux can be provided by a light source comprising an LED light source with peak wavelength in a range from about 450 nm to about 470 nm.

Light flux can be provided by a light source comprising a fluorescent lamp that emits light with a wavelength in a range from about 365 nm to about 480 nm.

Light flux can be provided by a light source comprising a fluorescent lamp that emits light with a wavelength in a range from about 365 nm to about 470 nm.

Light flux can be provided by a light source comprising a fluorescent lamp that emits light with a wavelength in a range from about 450 nm to about 470 nm.

The light flux can be in a range from about 10 to about 100 $mW/cm^2$.

The light flux can be in a range from about 30 to about 50 mW/cm2.

The light flux can be in a range from about 20 to about 35 mW/cm2,

The light flux can be in a range from about 20 to about 30 mW/cm2.

Other types of light sources that can emit light at the desired wavelength and with the desired intensity can also be used.

Preferably, the light flux to which the optical material is exposed is uniform.

Exposing an optical component including optical material to heat can comprise exposing the optical material to a temperature greater than 20° C.

Exposing an optical component including optical material to heat can comprise exposing the optical material to a temperature of at least 25° C.

Exposing an optical component including optical material to heat can comprise exposing the optical material to a temperature in a range from about 25° to about 80° C.

Preferably, the temperature does not exceed a temperature which is detrimental to the performance of the optical material or any encapsulation material.

The method can provide stabilized the color attributes of photoluminescent emission from the treated an optical component including optical material.

The method can provide stabilized peak emission wavelength of photoluminescent emission from the treated an optical component including optical material.

Other information provided herein may also be useful in practicing the above method.

In accordance with a still further aspect of the present invention, there is provided a method for treating an optical component including an optical material comprising quantum confined semiconductor nanoparticles, the method comprising exposing an optical component including at least partially encapsulated optical material to a light flux for a period of time sufficient to increase the solid state photoluminescent quantum efficiency of the optical material by at least 10% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 20% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 30% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 40% of its pre-exposure solid state photoluminescent quantum efficiency value.

The method can comprise exposing the optical component including at least partially encapsulated optical material to a light flux for a period of time sufficient to increase solid state photoluminescent efficiency of the optical material by at least 50% of its pre-exposure solid state photoluminescent quantum efficiency value.

The method can comprise exposing the optical component including at least partially encapsulated optical material to a light flux for a period of time until the solid state photoluminescent efficiency increases to a substantially constant value.

Optical material can be partially encapsulated to various extents.

For example, more than 50% of the surface area of the optical material included in an optical component being treated can be protected by one or more barrier materials.

The method can further include exposing an optical component to light flux when the optical material is fully encapsulated.

In certain preferred embodiments, the optical material is fully encapsulated.

The optical material can further comprise a host material in which the nanoparticles are dispersed.

The optical material can further comprise light scatterers.

The optical material can further comprise other optional additives.

The method can comprise exposing the optical component including at least partially encapsulated optical material to a light flux for a period of time until the solid state photoluminescent efficiency increases to a substantially constant value.

The method can further comprise exposing the optical component including at least partially encapsulated optical material to a light flux and heat at the same time.

The method can comprise exposing the optical component including at least partially encapsulated optical material to heat during at least a portion of the time the optical material is exposed to light flux.

The method can comprise exposing the optical component including at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical component including optical material to light flux when the optical material is fully encapsulated.

The method can comprise exposing optical component including partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical component to heat, exposing to heat can comprise exposing the optical component to a temperature greater than 20° C.

If the method further includes exposing the optical component to heat, exposing to heat can comprise exposing the optical component to a temperature of at least 25° C.

If the method further includes exposing the optical component to heat, exposing to heat can comprise exposing the optical component to a temperature in a range from about 25° to about 80° C.

The method can provide stabilized the color attributes of photoluminescent emission from the treated optical component.

The method can provide stabilized peak emission wavelength of photoluminescent emission from the treated optical component.

Other information provided herein may also be useful in practicing the above method.

In accordance with a further aspect of the present invention, there is provided a method for treating an optical component including an optical material comprising quantum confined semiconductor nanoparticles, the method comprising exposing the optical component including at least partially encapsulated optical material to a light flux for a period of time sufficient to achieve a solid state photoluminescent efficiency of the optical material greater than or equal to about 60%.

For example, the optical component including at least partially encapsulated optical material can be exposed to light flux for a period of time sufficient to achieve a solid state photoluminescent quantum efficiency greater than or equal to 65%, greater than 70%, greater than 75%, greater than 80%, greater than 85%, greater than 90%, etc.

The method can comprise exposing the optical component including at least partially encapsulated optical material to a light flux for a period of time until the solid state photoluminescent efficiency increases to a substantially constant value.

Optical material can be partially encapsulated to various extents.

For example, more than 50% of the surface area of the optical material included in an optical component being treated can be protected by one or more barrier materials.

In certain preferred embodiments, the optical material is fully encapsulated.

The optical material can further comprise a host material in which the nanoparticles are dispersed.

The optical material can further comprise light scatterers.

The optical material can further comprise other optional additives.

The method can comprise exposing the optical component including at least partially encapsulated optical material to a light flux for a period of time until the solid state photoluminescent efficiency increases to a substantially constant value.

The method can further comprise exposing the optical component including at least partially encapsulated optical material to a light flux and heat at the same time.

The method can comprise exposing the optical component including at least partially encapsulated optical material to heat during at least a portion of the time the optical material is exposed to light flux.

The method can comprise exposing the optical component including at least partially encapsulated optical material to a light flux to light flux and heat sequentially.

The method can be carried out in a nitrogen atmosphere.

The method can be carried out in an atmosphere that includes oxygen (e.g., but not limited to, air).

The method can be carried out in an inert atmosphere.

The method can include exposing optical component including optical material to light flux when the optical material is fully encapsulated.

The method can comprise exposing optical component including partially encapsulated optical material to light flux to achieve the desired result and fully encapsulating optical material following exposure to light flux.

The light flux can comprise a peak wavelength in a range from about 365 nm to about 480 nm.

The light flux can comprise peak wavelength in a range from about 450 nm to about 470 nm.

The light flux can have a center wavelength less than the bandgap of the quantum confined semiconductor nanoparticles included in the optical material included in the optical component.

The light flux can be in a range from about 10 to about 100 mW/cm$^2$.

If the method further includes exposing the optical component to heat, exposing to heat can comprise exposing the optical component to a temperature greater than 20° C.

If the method further includes exposing the optical component to heat, exposing to heat can comprise exposing the optical component to a temperature of at least 25° C.

If the method further includes exposing the optical component to heat, exposing to heat can comprise exposing the optical component to a temperature in a range from about 25° to about 80° C.

The method can provide stabilized the color attributes of photoluminescent emission from the treated optical component.

The method can provide stabilized peak emission wavelength of photoluminescent emission from the treated optical component.

Other information provided herein may also be useful in practicing the above method.

In accordance with a further aspect of the present invention, there is provided a method for improving at least one of solid state photoluminescent efficiency and a performance stability property of an optical component including an optical material comprising quantum confined semiconductor nanoparticles, wherein the method comprises a method taught herein for treating an optical component.

An optical component treated in accordance with the invention can include an optical material having a solid state photoluminescent efficiency that does not change by more than 40% upon exposure to air for 60 days at 20° C. under fluorescent room light.

An optical component treated in accordance with the invention can include an optical material having a solid state photoluminescent efficiency that does not change by more than 30% upon exposure to air for 60 days at 20° C. under fluorescent room light.

An optical component treated in accordance with the invention can include an optical material having a solid state photoluminescent efficiency that does not change by more than 20% upon exposure to air for 60 days at 20° C. under fluorescent room light.

An optical component treated in accordance with the invention can include an optical material having a solid state photoluminescent efficiency that does not change by more than 10% upon exposure to air for 60 days at 20° C. under fluorescent room light.

An optical component treated in accordance with the invention can include an optical material having a solid state photoluminescent efficiency that does not change by more than 5% upon exposure to air for 60 days at 20° C. under fluorescent room light.

In accordance with another aspect of the present invention, there is provided a device including an optical material taught herein.

In accordance with another aspect of the present invention, there is provided a device including an optical material treated by a method taught herein.

In accordance with another aspect of the present invention, there is provided a device including an optical component taught herein.

In accordance with another aspect of the present invention, there is provided a device including an optical component treated by a method taught herein.

In accordance with another aspect of the present invention, there is provided a method for improving the solid state photoluminescent efficiency of an optical material comprising quantum confined semiconductor nanocrystals that has been previously handled in or exposed to an atmosphere including oxygen. The method comprises exposing the previously oxygen exposed optical material comprising quantum confined semiconductor nanocrystals to light flux for a period of time sufficient to increase the solid state photoluminescent efficiency thereof, wherein the optical material is partially encapsulated during the exposure step.

The method can be carried out in an atmosphere that includes oxygen.

The method can be carried out in an inert atmosphere.

The method can be carried out in a nitrogen atmosphere.

The light flux can comprise a peak wavelength in a range from about 365 nm to about 480 nm.

The light flux can comprise a peak wavelength in a range from about 365 nm to about 470 nm.

The light flux can comprise a peak wavelength that is less than the bandgap of the nanoparticles.

The light flux can be in a range from about 10 to about 100 mW/cm$^2$.

Optical material can be partially encapsulated to various extents.

For example, more than 50% of the surface area of the optical material being treated can be protected by one or more barrier materials.

The method can further include exposing optical material to light flux when the optical material is fully encapsulated.

Preferably, the optical material is fully encapsulated.

The method can further include exposing the optical material to heat at least a portion of the time the optical component is exposed to light flux.

The method can further include exposing the optical material to heat during the total time the optical component is exposed to light flux.

Exposing the optical material to heat can comprise heating the optical material at a temperature greater than 20° C.

An optical material can comprise quantum confined semiconductor nanoparticles that include a core comprising a first semiconductor material and a shell on at least a portion of the outer surface of the core, the shell comprising one or more layers, wherein each layer may comprise a semiconductor material that is the same or different from that included in each of any other layer.

The method can further include fully encapsulating the optical material following exposure to light flux and heat. Such encapsulation step can be carried out in an oxygen free environment.

Preferably, the optical material is fully encapsulated while being exposed to light flux.

The optical material can be at least partially or fully encapsulated by one or more barrier materials.

A barrier material can comprise a material that is a barrier to oxygen.

A barrier material can comprise a material that is a barrier to oxygen and water.

An optical material can be included in an optical component or other device when exposed to light flux.

In accordance with another aspect of the invention, there is provided an optical material and an optical component treated by methods taught herein.

FIG. 1 provides a schematic diagram of an example of a set-up that can be useful in carrying out the methods taught herein. In the Figure, "PL Samples" refer to placement of optical materials and/or optical components in the configuration during treatment. As depicted, the light sources are LEDs, but as discussed herein, other types of light sources can be used. The inner surface of the set-up can be light reflective.

In the methods taught herein, exposing an optical material or optical component, as the case may be, can comprise for example, carrying out the irradiation step in an oven (e.g., an IR oven, a convection oven, etc.), on a hot plate, etc. Other heating techniques readily ascertainable by the skill artisan can also be used. Heating of the optical material and/or optical component during exposure to light flux (e.g., irradiation by a light source) can accelerate or assist the radiation effects thereon. For example, heating at a temperature in a range from about 25 to about 8 C.° can reduce irradiation time to reach a constant solid state photoluminescent efficiency to less than 24 hours, less than 12 hours, less than 6 hours, less than 3 hours, less than 30 minutes/

In addition to other information regarding light flux provided elsewhere herein, examples of light sources that can be utilized for the irradiation step include, but are not limited to, blue (e.g., 400-500 nm) light-emitting diodes (LEDs), blue emitting fluorescent lamps, etc.

Examples of blue emitting fluorescent lamps are available from NARVA (Germany). In certain embodiments, the light source comprises NARVA model LT 54 W T-5-HQ/0182 blue 2.

Examples of techniques that can be used to measure light flux include UV detectors that are sensitive to the wavelength of the radiation source. For example, an Ophir Nova Laser Power Meter (part number 7Z01500) including an Ophir UV detector head (part number PD300-UV-SH-ROHS) (preferably a detector head filter is installed) can be used with a 450 nm LED radiation source.

Light flux is preferably measured at the surface being irradiated.

Quantum confined semiconductor nanoparticles included in optical materials described herein can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

In certain embodiments, the quantum confined semiconductor nanoparticles include at least one type of quantum confined semiconductor nanoparticle with respect to chemical composition, structure, and size. The type(s) of quantum confined semiconductor nanoparticles included in an optical component in accordance with the invention are determined by the wavelength desired for the particular end-use application in which the optical component will be used.

As discussed herein, quantum confined semiconductor nanoparticles may or may not include a shell and/or a ligand on a surface thereof. In certain embodiments, a shell and/or ligand can passivate quantum confined semiconductor nanoparticles to prevent agglomeration or aggregation to overcome the Van der Waals binding force between the nanoparticles. In certain embodiments, the ligand can comprise a material having an affinity for any host material in which a quantum confined semiconductor nanoparticle may be included. As discussed herein, a shell can comprise an inorganic shell.

An optical material can include two or more different types of quantum confined semiconductor nanoparticles (based on composition, structure and/or size), wherein each type is selected to obtain light having a predetermined color.

An optical material can comprise one or more different types of quantum confined semiconductor nanoparticles (based on composition, structure and/or size), wherein each different type of quantum confined semiconductor nanoparticles emits light at predetermined wavelength that is different from the predetermined wavelength emitted by at least one of any other type of quantum confined semiconductor nanoparticles included in the optical material, and wherein the one or more different predetermined wavelengths are selected based on the end-use application.

If use of two or more different types of quantum confined semiconductor nanoparticles that emit at different predetermined wavelengths is desired, the different types of quantum confined semiconductor nanoparticles can be included in two or more different optical materials.

If two or more different optical materials are used, such different optical materials can, for example, be included as separate layers of a layered arrangement and/or as separate features of a patterned layer that includes features including features of more than one of the optical materials.

An optical material described herein can comprise quantum confined semiconductor nanoparticles distributed in a host material.

A host material can comprises a solid host material.

Examples of a host material useful in various embodiments and aspect of the inventions described herein include polymers, monomers, resins, binders, glasses, metal oxides, and other nonpolymeric materials.

Preferred host materials for optical materials include polymeric and non-polymeric materials that are at least partially transparent, and preferably fully transparent, to preselected wavelengths of light.

Preselected wavelengths can include wavelengths of light in the visible (e.g., 400-700 nm) region of the electromagnetic spectrum.

Other examples of host materials include cross-linked polymers and solvent-cast polymers, glass or a transparent resin. A resin such as a non-curable resin, heat-curable resin, or photocurable resin can be suitably used from the viewpoint of processability. Additional examples of such a resin can be in the form of either an oligomer or a polymer, a melamine resin, a phenol resin, an alkyl resin, an epoxy resin, a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like. Other host materials can be identified by persons of ordinary skill in the relevant art.

A host material can comprise a photocurable resin. A photocurable resin may be a preferred host material, e.g., where the optical material is to be patterned. As a photocurable resin, a photo-polymerizable resin such as an acrylic acid or methacrylic acid based resin containing a reactive vinyl group, a photo-crosslinkable resin which generally contains a photo-sensitizer, such as polyvinyl cinnamate, benzophenone, or the like may be used. A heat-curable resin may be used when a photo-sensitizer is not used. These resins may be used individually or in combination of two or more.

A host material can comprises a solvent-cast resin. A polymer such as a polyurethane resin, a maleic resin, a polyamide resin, polymethyl methacrylate, polyacrylate, polycarbonate, polyvinyl alcohol, polyvinylpyrrolidone, hydroxyethylcellulose, carboxymethylcellulose, copolymers containing monomers forming these resins, and the like can be dissolved in solvents known to those skilled in the art. Upon evaporation of the solvent, the resin forms a solid host material for quantum confined semiconductor nanoparticles.

As mentioned above, an optical material can comprise light scatterers and/or other additives (e.g., wetting or leveling agents).

Examples of light scatterers (also referred to herein as scatterers or light scattering particles) that can be used in the embodiments and aspects of the inventions described herein, include, without limitation, metal or metal oxide particles, air bubbles, and glass and polymeric beads (solid or hollow). Other light scatterers can be readily identified by those of ordinary skill in the art. In certain embodiments, scatterers have a spherical shape. Preferred examples of scattering particles include, but are not limited to, $TiO_2$, $SiO_2$, $BaTiO_3$, $BaSO_4$, and ZnO. Particles of other materials that are non-reactive with the host material and that can increase the absorption pathlength of the excitation light in the host material can be used. In certain embodiments, light scatterers may have a high index of refraction (e.g., $TiO_2$, $BaSO_4$, etc) or a low index of refraction (gas bubbles).

Selection of the size and size distribution of the scatterers is readily determinable by those of ordinary skill in the art. The size and size distribution can be based upon the refractive index mismatch of the scattering particle and the host material in which it the light scatterer is to be dispersed, and the preselected wavelength(s) to be scattered according to Rayleigh scattering theory. The surface of the scattering particle may further be treated to improve dispersability and stability in the host material. In one embodiment, the scattering particle comprises $TiO_2$ (R902+ from DuPont) of 0.2 µm particle size, in a concentration in a range from about 0.001 to about 5% by weight. In certain preferred embodiments, the concentration range of the scatterers is between 0.1% and 2% by weight.

An optical material including quantum confined semiconductor nanoparticles and a host material can be prepared, for example, from an ink comprising quantum confined semiconductor nanoparticles and a liquid vehicle, wherein the liquid vehicle comprises a composition including one or more functional groups that are capable of being cross-linked. The functional units can be cross-linked, for example, by UV treatment, thermal treatment, or another cross-linking technique readily ascertainable by a person of ordinary skill in a relevant art.

A composition including one or more functional groups that are capable of being cross-linked can be the liquid vehicle itself.

A composition including one or more functional groups that are capable of being cross-linked can be a co-solvent.

A composition including one or more functional groups that are capable of being cross-linked can be a component of a mixture with the liquid vehicle. An ink can further include light scatterers.

Quantum confined semiconductor nanoparticles (e.g., semiconductor nanocrystals) can be distributed within the host material as individual particles.

As described herein, an optical material can comprise quantum confined semiconductor nanoparticles dispersed in a host material.

An optical material can comprise up to about 30 weight percent quantum confined semiconductor nanoparticles based on the weight of the host materials. For example, an optical material can include from about 0.001 to about 25, from about 0.001 to about 20, from about 0.001 to about 15, from about 0.001 to about 10, from about 0.001 to about 5, from about 0.01 to about 4, from about 0.01 to about 3, from about 0.1 to about 3, from about 0.1 to 2, from about 0.5 to about weight percent quantum confined semiconductor nanoparticles based on the weight of the host material. weight percent quantum confined semiconductor nanoparticles based on the weight of the host material.

An optical material can also comprise light scatterers.

An optical material can include an amount of light scatterers in a range from 0.01 weight percent based on the weight of the optical material up to an amount that is the same as the amount of quantum confined semiconductor nanoparticles included in the optical material.

An optical material can include from about 0.001 to about 5 weight percent scatterers based on the weight of the optical material.

An optical component can comprise a structural member.

A structure member can comprise a rigid material, e.g., glass, polycarbonate, acrylic, quartz, sapphire, or other known rigid materials.

Examples of glasses include, but are not limited to, borosilicate glass, soda-lime glass, and aluminosilicate glass. Other glasses can be readily ascertained by one of ordinary skill in the art.

Non-limiting examples of structural members are described herein.

An example of a common structural member that can be used in an optical component and/or for at least partially encapsulating an optical material is a glass substrate.

A structural member can comprise a flexible material, e.g., a polymeric material such as plastic (e.g. but not limited to thin acrylic, epoxy, polycarbonate, PEN, PET, PE) or silicone.

A barrier material can be a composite, consisting of multiple layers of different components, or coatings on a substrate.

A structural member can comprise a flexible material including a silica or glass coating thereon. If flexibility is desired, the silica or glass coating is selected to be sufficiently thin to retain the flexible nature of the base flexible material.

A structural member can be selected to be substantially optically transparent to wavelengths of interest for the particular end-use application. For example, the structural member can be selected to be at least 90% transparent, at least 95% transparent, at least 99% transparent.

A structural member can be selected to be optically translucent.

A structural member can be selected to be have a transmission haze (as defined in ASTM D1003-0095) in a range from about 0.1% to about 5%. (ASTM D1003-0095 is hereby incorporated herein by reference.)

A structural member can comprise a smooth surface.

A structural member can comprise a non-smooth surface.

A structural component can comprise a substrate wherein, one or both of the major surfaces of the substrate is smooth.

A structural component can comprise a substrate wherein one or both major surfaces of the substrate can be corrugated.

A structural component can comprise a substrate wherein one or both major surfaces of the substrate can be roughened.

A structural component can comprise a substrate wherein one or both major surfaces of the substrate can be textured.

A structural component can comprise a substrate wherein one or both major surfaces of the substrate can be concave.

A structural component can comprise a substrate wherein one or both major surfaces of the substrate can be convex.

A structural component can comprise a substrate wherein one major surface of the substrate can comprise microlenses.

A structural component can comprise a substrate wherein one or more surfaces is flat, concave, convex, or featured (e.g., including one or more positive or negative features).

A structural component can comprise other surface characteristics that are selected to be included based on the particular end-use application.

A structural component can comprise a geometrical shape and dimensions that can be selected based on the particular end-use application.

A structural component can have a thickness that is substantially uniform.

An optical component can include at least one layer including an optical material comprising quantum confined semiconductor nanoparticles.

An optical component can include more than one type of quantum confined semiconductor nanoparticles.

Each type can be included in a separate optical material and each can be disposed as a separate layer.

Each of the different types can be included in the same optical material,

An optical material can be disposed on a surface of a structural member.

An optical material can be disposed as an uninterrupted layer across a surface of a structural member.

An optical material can be disposed as a layer.

A layer comprising an optical material can have a thickness from about 0.1 to about 200 microns.

A layer comprising an optical material can have a thickness from about 10 to about 200 microns.

A layer comprising an optical material can have a thickness from about 30 to about 80 microns.

An optical component can include other optional layers.

While further including may be undesirable for energy considerations, there may be instances in which a filter is included for other reasons. In such instances, a filter may be included. If included, a filter may cover all or at least a predetermined portion of the structural member. A filter can be included for blocking the passage of one or more predetermined wavelengths of light. A filter layer can be included over or under the optical material.

An optical component can include multiple filter layers on various surfaces of structural member. A notch filter layer can optionally be included.

An optical component can include one or more anti-reflection coatings.

An optional component can include one or more wavelength selective reflective coatings. Such coatings can be included, for example, to reflect light back toward the light source.

An optical component may further include outcoupling members or structures across at least a portion of a surface thereof. For example, outcoupling members or structures may be uniformly distributed across a surface. Outcoupling members or structures may vary in shape, size, and/or frequency in order to achieve a more uniform light distribution outcoupled from the surface. Outcoupling members or structures may be positive, e.g., sitting or projecting above the surface of optical component, or negative, e.g., depressions in the surface of the optical component, or a combination of both.

An optical component can optionally include a lens, prismatic surface, grating, etc. on the surface thereof from which light is emitted. Other coatings can also optionally be included on such surface.

Outcoupling members or structures can be formed, for example, by molding, embossing, lamination, applying a curable formulation (formed, for example, by techniques including, but not limited to, spraying, lithography, printing (screen, inkjet, flexography, etc), etc.).

A structural member can include light scatterers.

A structural member can include air bubbles or air gaps.

An optical component can include one or more major, surfaces with a flat or matte finish.

An optical component can include one or more surfaces with a gloss finish.

Example of barrier films or coatings include, without limitation, a hard metal oxide coating, a thin glass layer, and Barix coating materials available from Vitex Systems, Inc. Other barrier films or coating can be readily ascertained by one of ordinary skill in the art.

As mentioned herein, one or more barrier materials can be used to fully or partially encapsulate the optical material. A barrier material can comprise a film. A barrier material can comprise a coating. A barrier material can comprise a structural member.

A seal can comprise glass frit, glass frit in a binder system, solder in combination with a metallized substrate. Other sealants can be used. Other known techniques for sealing glass-to-glass, glass-to-metal, and barrier films or sealants together can be used.

Preferably, a seal will not partially or fully delaminate or otherwise fail during the useful lifetime of the optical component.

Barrier materials can also be sealed together by a seal material comprising an adhesive material that can be chosen for its optical transmission properties and its adhesion qualities.

Barrier materials and sealing materials preferably will not yellow or discolor during sealing. More preferably, barrier materials and sealing materials will not yellow or discolor during the useful lifetime of the optical component so as to substantially alter the optical properties of the optical material or optical component.

Preferably a sealing material has oxygen barrier properties.

A sealing material can also have moisture barrier properties.

Sealing materials can preferably be hardened (e.g., cured or dried) under conditions that are not detrimental to an optical material and the external quantum efficiency of an optical material. Examples include, but are not limited to, sealants such as an adhesive material can be UV cured, e.g., UV curable acrylic urethanes, such as products sold by Norland Adhesives called Norland 68 and Norland 68 T.

An optical component can further include a cover, coating or layer for protection from the environment (e.g., dust, moisture, and the like) and/or scratching or abrasion.

In certain aspects and embodiments of the inventions taught herein, the optical material (e.g., comprising quantum confined semiconductor nanoparticles dispersed in a host material (preferably a polymer or glass)) can be exposed to light flux for a period of time sufficient to increase the solid state photoluminescent efficiency of the optical material. In certain embodiments, the optical material can be exposed to light and heat for a period of time sufficient to increase the solid state photoluminescent efficiency of the optical material. In certain embodiments, the exposure to light or light and heat can be continued for a period of time until the solid state photoluminescent efficiency reaches a substantially constant value.

In certain embodiments, a light source that emits light with a wavelength in a range from about 365 to about 480 nm can be used as the source of light. In certain embodiments, a light source that emits light with a wavelength in a range from about 365 to about 470 nm can be used as the source of light.

In certain embodiments, a light source can comprise an LED light source with peak wavelength in a range from about 365 nm to about 480 nm. In certain embodiments, a light source can comprise a fluorescent lamp that emits light with a wavelength in a range from about 365 nm to about 480 nm.

In certain embodiments, a light source can comprise an LED light source with peak wavelength in a range from about 365 nm to about 470 nm. In certain embodiments, a light source can comprise a fluorescent lamp that emits light with a wavelength in a range from about 365 nm to about 470 nm.

In certain embodiments, the optical material can be irradiated by a light source with peak wavelength in a range from about 450 nm to about 470 nm. In certain embodiments, an LED light source with peak wavelength a range from about 450 nm to about 470 nm can be used as the source of light.

Other known light sources can be readily identified by the skilled artisan.

In certain embodiments, the light flux can be from about 10 to about 100 mW/cm$^2$, preferably from about 20 to about 35 mW/cm$^2$, and more preferably from about 20 to about 30 mW/cm$^2$. In embodiments that include exposing the optical material to light and heat, the optical material can be exposed to light while at a temperature in a range from about 25° to about 80° C.

In certain embodiments, the optical material (e.g., comprising quantum confined semiconductor nanoparticles dispersed in a host material (preferably a polymer or glass)) can be encapsulated (for example, a layer of optical material can be disposed between glass plates) when exposed to light, whether or not heat is also applied. In certain examples, the glass plates can further be sealed together around the perimeter or edge. In certain embodiments, the seal can comprise barrier material. In certain embodiments, the seal can comprise an oxygen barrier. In certain embodiments, the seal can comprise a water barrier. In certain embodiments, the seal can comprise an oxygen and water barrier. In certain embodiments, the seal can be substantially impervious to water and/or oxygen. Examples of sealing techniques include, but are not limited to, glass-to-glass seal, glass-to-metal seal, sealing materials that are substantially impervious to oxygen and/or water, epoxies and other sealing materials that slow down penetration of oxygen and/or moisture. In certain embodiments, the optical material (e.g., comprising quantum confined semiconductor nanoparticles dispersed in a host material (preferably a polymer or glass)) can be partially encapsulated when exposed to light, whether or not heat is also applied.

Solid state photoluminescent efficiency can be measured, for example, with use of a spectrophotometer in an integrating sphere including a NIST traceable calibrated light source.

Figure 2:
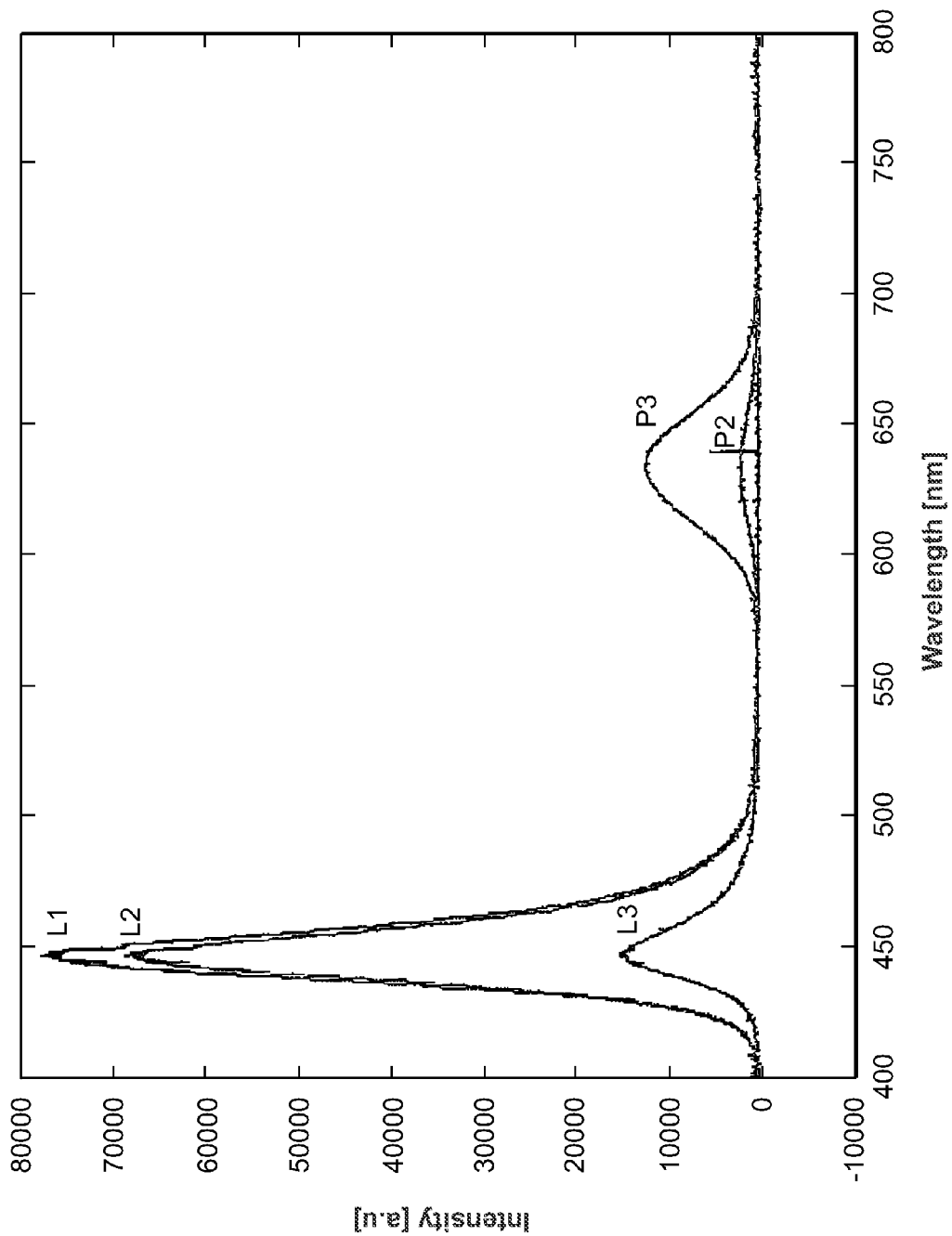
FIG. 2 depicts spectra to illustrate a method for measuring quantum efficiency.

Solid state external quantum efficiency (also referred to herein as "EQE" or "solid state photoluminescent efficiency is measured in a 12" integrating sphere using a NIST traceable calibrated light source, using the method developed by Mello et al., Advanced Materials 9(3):230 (1997), which is hereby incorporated by reference. The method uses a collimated 450 nm LED source, an integrating sphere and a spectrometer. Three measurements are taken. First, the LED directly illuminates the integrating sphere giving a spectrum labeled L1 and shown in FIG. 2 (which graphically represents emission intensity (a.u.) as a function of wavelength (nm)) for purposes of example in describing this method. Next, the PL sample is placed into the integrating sphere so that only diffuse LED light illuminates the sample giving the (L2+P2) spectrum shown for purposes of example in FIG. 2. Finally, the PL sample is placed into the integrating sphere so that the LED directly illuminates the sample (just off normal incidence) giving the (L3+P3) spectrum shown for purposes of example 4. After collecting the data, each spectral contribution (L's and P's) is computed. L1, L2 and L3 correspond to the sums of the LED spectra for each measurement and P2 and P3 are the sums associated with the PL spectra for 2nd and 3rd measurements. The following equation then gives the external PL quantum efficiency:

$$EQE=[(P3 \cdot L2) \text{minus} (P2 \cdot L3)]/(L1 \cdot (L2 \text{ minus } L3))$$

In certain embodiments, the optical material can further include light scattering particles and other optional additives described herein.

The present invention will be further clarified by the following examples, which are intended to be exemplary of the present invention.

EXAMPLES

Example 1

Preparation of Semiconductor Nanocrystals

A. Preparation of Semiconductor Nanocrystals Capable of Emitting 588 nm Light with 3,5-di-tert-butyl-4-hydroxybenzylphosphonic acid Synthesis of CdSe Cores: 1.75 mmol cadmium acetate is dissolved in 15.7 mmol of tri-n-octylphosphine at 140° C. in a 20 mL vial and then dried and degassed for one hour. 31.0 mmol of trioctylphosphine oxide and 4 mmol of octadecylphosphonic acid are added to a 3-neck flask and dried and degassed at 110° C. for one hour. After degassing, the Cd solution is added to the oxide/acid flask and the mixture is heated to 270° C. under nitrogen. Once the temperature reaches 270° C., 16 mmol of tri-n-butylphosphine is injected into the flask. The temperature is brought back to 270° C. where 2.3 mL of 1.5 M TBP-Se is then rapidly injected. The reaction mixture is heated at 270° C. for 30 seconds and then the heating mantle is removed from the reaction flask allowing the solution to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=518/529/26.5). Synthesis of CdSe/CdZnS Core-Shell Nanocrystals: Two identical reactions are set up whereby 25.86 mmol of trioctylphosphine oxide and 2.4 mmol of 3,5-di-tert-butyl-4-hydroxybenzylphosphonic acid are loaded into 50 mL four-neck round bottom flasks. The mixtures are then dried and degassed in the reaction vessels by heating to 120° C. for about an hour. The flasks are then cooled to 70° C. and the hexane solution containing isolated CdSe cores from above (0.062 mmol Cd content) are added to the respective reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (0.31 mmol of dimethylcadmium and diethylzinc) and S (1.24 mmol of hexamethyldisilathiane) samples are each dissolved in 4 mL of trioctylphosphine inside a nitrogen atmosphere glove box. Once the precursor solutions are prepared, the reaction flasks are heated to 155° C. under nitrogen. The Cd/Zn and S precursor solutions are added dropwise to the respective reaction flasks over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dispersed in toluene and the solutions from the two batches are combined B. Preparation of Semiconductor Nanocrystals Capable of Emitting 632 nm Light with 3,5-di-tert-butyl-4-hydroxybenzylphosphonic acid Synthesis of CdSe Cores: 29.9 mmol cadmium acetate is dissolved in 436.7 mmol of tri-n-octylphosphine at 140° C. in a 250 mL 3-neck round-bottom schlenk flask and then dried and degassed for one hour. 465.5 mmol of trioctylphosphine oxide and 61.0 mmol of octadecylphosphonic acid are added to a 0.5 L glass reactor and dried and degassed at 120° C. for one hour. After degassing, the Cd solution is added to the reactor containing the oxide/acid and the mixture is heated to 270° C. under nitrogen. Once the temperature reaches 270° C., 243.2 mmol of tri-n-butylphosphine is injected into the flask. The temperature is brought back to 270° C. where 33.3 mL of 1.5 M TBP-Se is then rapidly injected. The reaction mixture is heated at 270° C. for ~9 minutes at which point the heating mantle is removed from the reaction flask and the mixture is allowed to cool to room temperature. The CdSe cores are precipitated out of the growth solution inside a nitrogen atmosphere glovebox by adding a 3:1 mixture of methanol and isopropanol. The isolated cores are then dissolved in hexane and used to make core-shell materials. (Abs/Emission/FWHM (nm)=571/592/45)

Synthesis of CdSe/CdZnS Core-Shell Nanocrystals: Three identical reactions are conducted whereby 517.3 mmol of trioctylphosphine oxide and 48.3 mmol of 3,5-di-tert-butyl-4-hydroxybenzylphosphonic acid are loaded into a 0.5 L glass reactor. The mixtures are then dried and degassed in the reactor by heating to 120° C. for about an hour. The reactors are then cooled to 70° C. and hexane solutions containing the isolated CdSe cores from above (1.95 mmol Cd content) are added to the respective reaction mixtures. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S was in two-fold excess relative to the Cd and Zn. Two sets of Cd/Zn (5.5 mmol of dimethylcadmium and diethylzinc) and S (22 mmol of hexamethyldisilathiane) samples are each dissolved in 80 mL of trioctylphosphine inside a nitrogen atmosphere glove box. Once the precursor solutions are prepared, the reaction flasks are heated to 155° C. under nitrogen. The precursor solutions are added dropwise the respective reactor solutions over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The resulting precipitates are then dispersed in hexane and precipitated out of solution for a second time by adding a 3:1 mixture of methanol and isopropanol. The isolated core-shell nanocrystals are then dissolved in chloroform and the solutions from the three batches are mixed. (Abs/Emission/FWHM (nm)=610/632/40)

Example 2

Preparation of Optical Component including Two Different Types of Semiconductor Nanocrystals The following film is prepared using optical material including semiconductor nanocrystals (prepared substantially in accordance with the synthesis described in Example 1).

A. Optical Material Including Semiconductor Nanocrystals with a Peak Emission in the Orange Spectral Region:

The semiconductor nanocrystals prepared substantially in accordance with the synthesis described in Example 1A comprise orange-emitting semiconductor nanocrystals dispersed in Fluorobenzene have a peak emission at 588 nm, a FWHM of about 28 nm, a solution quantum yield of 83% and a concentration of 20 mg/ml.

2.7 ml of the 20 mg/ml suspension of the red-emitting nanocrystals is added from a 3 mL syringe to a 20 ml septum capped vial including a magnetic stirrer bar, the system is closed and purged through a syringe needle under vacuum then backfilled with nitrogen. Approximately 90 percent of the solvent is removed from the vial by vacuum stripping. 0.5 ml of RD-12, a low viscosity reactive diluent commercially available from Radcure Corp, 9 Audrey Pl, Fairfield, N.J. 07004-3401 is added. Remaining solvent is removed from the vial by vacuum stripping. 2.0 ml of DR-150 is then added to the vial through a syringe and the mixture is mixed using a Vortex mixer. (DR-150 is a UV-curable acrylic formulation commercially available from Radcure.). The mixture is then placed in an ultrasonic bath for approximately 15 minutes.

0.028 gram $TiO_2$ (Ti-Pure 902+ available from DuPont) is next added to the open vial and the mixture is mixed with a Vortex mixer followed by mixing with an homogenizer.

The vial is then capped and deaerated under vacuum and backfilled with nitrogen.

After mixing, the closed vial is put in an ultrasonic bath for 50 minutes. Care is taken to avoid temperatures over 40° C. while the sample is in the ultrasonic bath.

The sample is stored in the dark until used to make a combined formulation with long wavelength semiconductor and additional matrix material.

B. Optical Material Including Semiconductor Nanocrystals with a Peak Emission in the Red Spectral Region The semiconductor nanocrystals prepared substantially in accordance with the synthesis described in Example 1B comprise red-emitting semiconductor nanocrystals dispersed in Chloroform and have a peak emission at 632 nm, a FWHM of about 40 nm, a solution quantum yield of 60% and a concentration of 56.7 mg/ml.

99 ml of the 56.7 mg/ml suspension of the red-emitting nanocrystals is added to a septum capped Erlenmeyer flask including a magnetic stirrer bar, the system is closed and purged through a syringe needle under vacuum then backfilled with nitrogen. Approximately 95 percent of the solvent is removed from the vial by vacuum stripping. 46.6 ml of RD-12, a low viscosity reactive diluent commercially available from Radcure Corp, 9 Audrey Pl, Fairfield, N.J. 07004-3401 is added. Remaining solvent is removed from the vial by vacuum stripping. 187 ml of DR-150 is then added to the vial through a syringe and the mixture is mixed using a Vortex mixer. (DR-150 is a UV-curable acrylic formulation commercially available from Radcure.). The mixture is then placed in an ultrasonic bath for approximately 50 minutes.

Approximately 2.6 gram $TiO_2$ (Ti-Pure 902+ available from DuPont) is next added to the open vial as well as 12.9 grams of Esacure TPO previously ground to reduce particle size in a ball mill machine and the mixture is mixed with a Vortex mixer followed by mixing with an homogenizer.

The vial is then capped and deaerated under vacuum and backfilled with nitrogen.

After mixing, the closed vial is put in an ultrasonic bath for 60 minutes. Care is taken to avoid temperatures over 40° C. while the sample is in the ultrasonic bath. The sample is stored in the dark until used to make a combined formulation with long wavelength semiconductor and additional matrix material.

C. Preparation of Host Material Including Spacer Beads:

0.9 ml of RD-12, a low viscosity reactive diluent commercially available from Radcure Corp, 9 Audrey Pl, Fairfield, N.J. 07004-3401 and 3.8 ml of DR-150, also available from Radcure Corp, is added to a 40 ml vial and the mixture is mixed using a Vortex mixer. The mixture is then placed in an ultrasonic bath for approximately 30 minutes.

Approximately 0.05 gram $TiO_2$ (Ti-Pure 902+ available from DuPont) is next added to the open vial as well as 0.05 grams of GL0179B6/45 space beads available from MO-SCI Specialty Products, Rolla, Mo. 65401 USA, and then mixed using a Vortex mixer.

After mixing, the closed vial is put in an ultrasonic bath for approximately 50 minutes. Care is taken to avoid temperatures over 40° C. while the sample is in the ultrasonic bath. The sample is stored in the dark until used to make a combined formulation with long wavelength semiconductor and additional matrix material.

D. Preparation of Optical Material & Layer including Red and Orange Emitting Semiconductor Nanocrystals:

An optical material is formed by adding together in a 20 ml vial, 2.52 grams of the host material including spacer beads (prepared substantially in accordance with the procedure described in Example 1C), 0.99 grams of the optical material of Example 1B and 1.00 grams of the optical material of Example 1A. The mixture was stirred using a Vortex mixer followed by sonification in an ultrasonic bath for approximately 50 minutes.

Sample material from the combination vial is dispensed onto a Hexagon shaped flat Borosilicate glass which was previously cleaned using a caustic base bath, acid rinse, deionized water rinse, and a methanol wipe. A second Hexagon plate of the same size also previously cleaned is placed on top of the dispensed sample material and the sandwiched structure is massaged to spread the formulation evenly between the two glass plates. Excess formulation which squeezed out of the structure is wiped off of the outer portion of the glass and the Hexagon sandwich is cured in a 5000-EC UV Light Curing Flood Lamp from DYMAX Corporation system with an H-bulb (30-45 milliWatts/cm$^2$) for 10 seconds. The thickness of the nanocrystal containing layer is approximately 70-79 µm (approximately 360 mg of formulation).

The Hexagon sandwich consisting of two Hexagon shaped flat plates of Borosilicate glass with cured layer of acrylic containing a sample of the optical material prepared substantially as described in Example 6.

Six samples (Samples A-F) were prepared substantially as described in Example 2. Initial CCT, CRI, and External Quantum Efficiency measurements were taken for each sample prior to heating each sample to approximately 50° C. and irradiating the sample to approximately 30 mW/cm2 of 450 nm blue light for the time specified in following Table 1 for each of the samples. CCT, CRI, and EQE measurements were taken after the irradiation time listed for the respective sample. The data is set forth in the following Table 1.

TABLE 1

| | Irradiation at 50° C. @ 30 mW/cm2 | | | | | | |
|---|---|---|---|---|---|---|---|
| Sample Label | Initial CCT (K) | Initial CRI | Initial EQE (%) | Irradiation Time, Hrs | Final CCT (K) | Final CRI | Final EQE (%) |
| A | 2649 | 86.5 | 62 | 1 | 2482 | 87.1 | 78 |
| B | 2664 | 85.6 | — | 13 | 2519 | 87 | 82 |
| C | 2609 | 85.6 | 65 | 2 | 2444 | 87.1 | 77 |
| D | 2641 | 85.4 | 62 | 10 * | 2472 | 87.2 | 80 |
| E | 2659 | 85.2 | 63 | 11 | 2480 | 87.3 | 80 |
| F | 2684 | 84.5 | 60 | 11 | 2446 | 87.3 | 80 |

* 2 hrs 50 C. @ 30 mW/cm2 450 nm, 8 hrs 50 C. @ 15 mW/cm2 450 nm

Example 3

Preparation of Semiconductor Nanocrystals

A. Preparation of Semiconductor Nanocrystals Capable of Emitting Red Light with 3,5-di-tert-butyl-4-hydroxybenzyl-phosphonic acid Synthesis of CdSe Cores: 26.25 mmol cadmium acetate is dissolved in 235.4 mmol of tri-n-octylphosphine at 100° C. in a 250 mL 3-neck round-bottom flask and then dried and degassed for one hour. 465.5 mmol of trioctylphosphine oxide and 59.9 mmol of octadecylphosphonic acid are added to a 0.5 L glass reactor and dried and degassed at 140° C. for one hour. After degassing, the Cd solution is added to the reactor containing the oxide/acid and the mixture is heated to 270° C. under nitrogen. Once the temperature reaches 270° C., 240 mmol of tri-n-butylphosphine is injected into the flask. The temperature of the mixture is then raised to 308° C. where 60 mL of 1.5 M TBP-Se is then rapidly injected. The reaction mixture temperature drops to 284° C. for 30 seconds and then the heating mantle is removed from the reaction flask and the apparatus is cooled via two air guns. The first absorption peak of the nanocrystals is 551 nm. The CdSe cores are precipitated out of the growth solution inside a nitrogen atmosphere glovebox by adding a 3:1 mixture of methanol and isopropanol. The isolated cores are then dissolved in hexane and used to make core-shell materials.

Synthesis of CdSe/CdZnS Core-Shell Nanocrystals: 517.3 mmol of trioctylphosphine oxide and 48.3 mmol of 3,5-di-tert-butyl-4-hydroxybenzylphosphonic acid are loaded into a 0.5 L glass reactor. The mixture is then dried and degassed in the reactor by heating to 120° C. for about an hour. The reactor is then cooled to 70° C. and the hexane solution containing isolated CdSe cores (1.98 mmol Cd content) is added to the reaction mixture. The hexane is removed under reduced pressure. Dimethyl cadmium, diethyl zinc, and hexamethyldisilathiane are used as the Cd, Zn, and S precursors, respectively. The Cd and Zn are mixed in equimolar ratios while the S is in two-fold excess relative to the Cd and Zn. The Cd/Zn (6.13 mmol of dimethylcadmium and diethylzinc) and S (24.53 mmol of hexamethyldisilathiane) samples are each dissolved in 80 mL of trioctylphosphine inside a nitrogen atmosphere glove box. Once the precursor solutions are prepared, the reaction flask is heated to 155° C. under nitrogen. The precursor solutions are added dropwise over the course of 2 hours at 155° C. using a syringe pump. After the shell growth, the nanocrystals are transferred to a nitrogen atmosphere glovebox and precipitated out of the growth solution by adding a 3:1 mixture of methanol and isopropanol. The isolated core-shell nanocrystals are then dissolved in toluene and used to make optical materials. The material specifications are as follows: Abs=591 nm; Emission=603 nm; FWHM=30 nm; QY=85% in Toluene.

Example 4

Preparation of Optical Component

A. Optical Material Including Semiconductor Nanocrystals with a Peak Emission in the Red Spectral Region:

The Semiconductor nanocrystals prepared substantially in accordance with the synthesis described in Example 3 comprise red-emitting semiconductor nanocrystals dispersed in Toluene have a peak emission at 604 nm, a FWHM of about 29 nm, a solution quantum yield of 85% and a concentration of 18 mg/ml.

30.6 ml of the 18 mg/ml suspension of the red-emitting nanocrystals in toluene is added from a 10 mL syringe to a 125 ml septum capped Erlenmeyer flask including a magnetic stirrer bar; the system is closed and purged through a syringe needle under vacuum then backfilled with nitrogen multiple times prior to insertion of the suspension. Approximately 95 percent of the solvent is removed from the Erlenmeyer flask by vacuum stripping while stirring the solution with a magnetic stirrer bar 10 ml of RD-12, a low viscosity reactive diluent commercially available from Radcure Corp, 9 Audrey Pl, Fairfield, N.J. 07004-3401 is added to the Erlenmeyer flask through a syringe Remaining solvent is removed from the Erlenmeyer flask by vacuum stripping while stirring with the magnetic stirrer bar. The Erlenmeyer flask is then placed in an ultrasonic bath for approximately 15 minutes. 40 ml of DR-150 is then added to the Erlenmeyer flask through a syringe while the solution is mixed using the magnetic stir bar. Following the addition, the solution is further mixed using a Vortex mixer. (DR-150 is a UV-curable acrylic formulation commercially available from Radcure.).

0.270 gram $TiO_2$ (Ti-Pure 902+ available from DuPont) is next added to the open Erlenmeyer flask and the mixture is mixed with a Vortex mixer followed by mixing with an homogenizer. Approximately 0.2 grams of Tego 2500 is added dropwise and the solution mixed with a Vortex mixer followed by an additional 45 minutes in the ultrasonic bath. Care is taken to avoid temperatures over 40° C. while the sample is in the ultrasonic bath.

The sample is stored in the dark until used to make an optical component.

B. Optical Component Comprising Glass/Optical Material/Glass

Microscope slides are pre-cleaned using acetone followed by a methanol wipe. Two 80 micron shims are positioned at the corners of one end of the microscope slide and approximately one inch from that end. A small amount of Formulation described in example 4A is placed in the center of the area framed by the shims. A second microscope slide or piece of microscope slide is placed on top of the formulation, positioned such that the edges contact portions of the spacing shims. Small mini binder clips are positioned over the shims to hold the two pieces of glass together, care is taken to avoid shading the formulation with the clips. This structure is cured in a 5000-EC UV Light Curing Flood Lamp from DYMAX Corporation system with an H-bulb (30-45 mW/cm$^2$) for 10 seconds on each side. The clips are removed and the shim stock pulled out of the structure.

The samples are then irradiated by a 450 nm light flux of approximately 25 mW/cm2 at 50 C for the time indicated in Table 2. EQE measurements are made in a 12" integrating sphere using a NIST traceable calibrated light source.

Measurement for un-encapsulated samples are shown in Table 2 as Samples 1 and 2.

C. Optical Component Comprising Glass/Optical Material/Acrylate/Glass

Optical components can also be made sequentially. As an example, the optical material described in example 4A is coated onto a pre-cleaned microscope slide using a Mayer rod 52 yielding approximately 80 um film. This film is cured in an air environment using a 5000-EC UV Light Curing Flood Lamp from DYMAX Corporation system with an H-bulb such that the sample is exposed to energy of approximately 865 mJ/cm2.

Formation of a sealant layer over of the optical material and first substrate is effected by dispensing a sufficient quantity of a UV cure liquid acrylate based material on the cured optical material film such that when a mating glass slide is positioned on top of the structure, the acrylate based liquid covers the majority of the optical material film and preferably beads-up on the edge of the slides. The acrylate based liquid contained between the top microscope slide and the base microscope slide containing the cured optical component film is then cured in an air environment using a 5000-EC UV Light Curing Flood Lamp from DYMAX Corporation with an H-bulb such that the sample is exposed to energy of approximately 865 mJ/cm2.

External Quantum Efficiency (EQE) is measured on the samples formed in a 12" integrating sphere using a NIST traceable calibrated light source. The samples are then irradiated by a 450 nm light flux of approximately 25 mW/cm2 at 50° C. for the time indicated in Table 2. Post irradiation EQE measurements are made using the same technique.

Measurement for encapsulated samples are shown in Table 2 as Samples 3, 4, and 5.

TABLE 2

| Sample | Encapsulant | Initial EQE | Irradiation Time | Post-Irradiation EQE |
|--------|-------------|-------------|------------------|----------------------|
| 1 | None | 67 | 12 hours | 93 |
| 2 | None | 69 | 12 hours | 92 |
| 3 | Acrylate | 65 | 13 hours | 91 |
| 4 | Acrylate | 66 | 13 hours | 92 |
| 5 | Acrylate | 65 | 13 hours | 92 |

Example 5

A: Preparation of Optical Material Ink

Semiconductor nanocrystals having a peak emission at 611 nm, a FWHM of about 33 nm, a solution quantum yield of 71% were used. The semiconductor nanocrystals used were a mixture of semiconductor nanocrystals from 4 separately prepared batches. (Two of the batches were prepared generally following the procedure described in Example 3A; the other two were prepared using the same general procedure, but on a larger scale.) The nanocrystals were dispersed in toluene at a concentration of 20 mg/ml.

367.5 ml of the 20 mg/ml suspension of the red-emitting nanocrystals is contained in a 1 liter round bottom flask, and approximately 90 percent of the solvent is removed from the vial by vacuum stripping. 106.7 ml of RD-12, a low viscosity reactive diluent commercially available from Radcure Corp, 9 Audrey Pl, Fairfield, N.J. 07004-3401 is added. Remaining solvent is removed from the vial by vacuum stripping. The resulting solution is sonicated in an ultrasonic bath for 20 minutes before 427.5 ml of DR-150 is added to the flask and the mixture is sonicated for 20 minutes in an ultrasonic bath. (DR-150 is a UV-curable acrylic formulation commercially available from Radcure.).

4.63 grams of Tego RAD2500 surfactant is added to the open flask, followed by the addition of 1.97 grams $TiO_2$ (Ti-Pure 902+ available from DuPont) and the mixture is mixed with a rotor stator homogenizer (a product of IKA Labor Technik, model Ultra-Turrax T-25).

The flask containing the mixture is then put in an ultrasonic bath for 20 minutes. Care is taken to avoid temperatures over 40° C. while the sample is in the ultrasonic bath.

The sample was stored in the dark until used for the following process.

B. Preparation of Optical Component

An optical component was prepared by screen-printing approx. a film of optical material ink prepared substantially as described in Example 5A (above) onto each of two separate pre-cleaned glass plates. The ink is printed in air. After the ink is printed, the ink on the two plates is cured by exposure to 2 Dymax Fusion H-bulbs at about 50 milliwatts/$cm^2$ for about 30 seconds. The weight of cured ink film on each plate is approx. 0.2269 gram. The curing step is carried out under a blanket of nitrogen. After curing, the plates are returned to air. Next, an amount of optically clear adhesive material is dispensed upon the cured optical material on one of the two plates. The clear adhesive used is a UV curable acrylic urethane product sold by Norland Adhesives called Norland 68 T. (This adhesive material is optically transparent and has oxygen barrier properties). The second plate including cured ink is brought down in a controlled fashion to touch the top of the dispensed adhesive material. The second printed plate is then slowly pushed downwards (with the ink side facing the adhesive) while maintaining parallelism to the bottom glass plate. This compressive force is applied using an electromechanical universal testing machine (ADMET eXpert 7601). The compressive force is substantially uniform across the plate sandwich. The compressive force used is about 60 lbf. The force is held for about one minute before the force is removed. (The printed optical material is now fully encapsulated, being surrounded by the adhesive material on three sides, and by glass on the fourth side.) The compressed plate sandwich is then placed under a UV light source using two D Bulbs at about 140 mW/cm2 for approx. 50 sec. to cure the adhesive. The curing step is carried out in air.

Following the adhesive curing step, resulting optical component is placed on a hot plate at a temperature of 60° C. to uniformly heat the optical component while simultaneously exposing the surfaces of the optical component to uniform light flux of 40-50 mW/$cm^2$ and a 450 nm peak wavelength for 6 hours. (Light flux is measured using a OPHIR NOVA laser power meter.)

The solid state EQE was measured for the optical component after completion of the light flux and heat exposure step. The optical component was then placed in bubble wrap and stored in a clear plastic box at room temperature in a room lighted by commercial room fluorescent lighting conditions. After being so stored for about 78 days, the optical component was removed from its storage conditions and solid state measurements were taken. The measurements for the optical component initially and after being stored for about 78 days are set forth below in Table 3:

TABLE 3

| Day # | Solid State EQE | Absorption |
|-------|-----------------|------------|
| 0 | 75% | 69% |
| About 78 | 78% | 69% |

Quantum confined semiconductor nanoparticles can confine electrons and holes and have a photoluminescent property to absorb light and re-emit different wavelength light. Color characteristics of emitted light from quantum confined semiconductor nanoparticles depend on the size of the quantum confined semiconductor nanoparticles and the chemical composition of the quantum confined semiconductor nanoparticles.

The type(s) of quantum confined semiconductor nanoparticles included in an optical material or optical component in accordance with the present invention can be determined by the wavelength of light to be converted and the wavelengths of the desired light output. As discussed herein, quantum confined semiconductor nanoparticles may or may not include a shell and/or a ligand on a surface thereof. A shell and/or ligand can passivate quantum confined semiconductor nanoparticles to prevent agglomeration or aggregation to overcome the Van der Waals binding force between the nanoparticles.

The size and composition of quantum confined semiconductor nanoparticles (including, e.g., semiconductor nanocrystals) useful in the various aspects and embodiments of the inventions can be selected such that semiconductor nanocrystals emit photons at a predetermined wavelength of wavelength band in the far-visible, visible, infra-red or other desired portion of the spectrum. For example, the wavelength can be between 300 and 2,500 nm or greater, such as between 300 and 400 nm, between 400 and 700 nm, between 700 and 1100 nm, between 1100 and 2500 nm, or greater than 2500 nm.

Quantum confined semiconductor nanoparticles (including, e.g., semiconductor nanocrystals) are nanometer-scale inorganic semiconductor nanoparticles. Semiconductor nanocrystals include, for example, inorganic crystallites between about 1 nm and about 1000 nm in diameter, preferably between about 2 nm and about 50 um, more preferably about 1 nm to about 20 nm (such as about 6, 7, 8, 9, 10, 11, 12, 13, 14, 15, 16, 17, 18, 19, or 20 nm).

Because semiconductor nanocrystals have narrow emission linewidths, are photoluminescent efficient, and emission wavelength tunable with the size and/or composition of the nanocrystals, they are preferred quantum confined semiconductor nanoparticles for use in the various aspects and embodiments of the inventions described herein.

Semiconductor nanocrystals included in various aspect and embodiments of the inventions most preferably have an average nanocrystal diameter less than about 150 Angstroms (Å). In certain embodiments, semiconductor nanocrystals having an average nanocrystal diameter in a range from about 12 to about 150 Å can be particularly desirable.

However, depending upon the composition and desired emission wavelength of the semiconductor nanocrystal, the average diameter may be outside of these various preferred size ranges.

Semiconductor materials that can form a nanoparticles and nanocrystals for use in the various aspects and embodiments of the inventions described herein can comprise Group IV elements, Group II-VI compounds, Group II-V compounds, Group III-VI compounds, Group III-V compounds, Group IV-VI compounds, Group compounds, Group II-IV-VI compounds, or Group II-IV-V compounds, for example, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

Examples of the shape of the nanoparticles and nanocrystals include sphere, rod, disk, other shape or mixtures thereof.

In certain preferred aspects and embodiments of the inventions, quantum confined semiconductor nanoparticles (including, e.g., semiconductor nanocrystals) include a "core" of one or more first semiconductor materials, which may include an overcoating or "shell" of a second semiconductor material on at least a portion of a surface of the core. In certain embodiments, the shell surrounds the core. A quantum confined semiconductor nanoparticle (including, e.g., semiconductor nanocrystal) core including a shell on at least a portion of a surface of the core is also referred to as a "core/shell" semiconductor nanocrystal.

For example, a quantum confined semiconductor nanoparticle (including, e.g., semiconductor nanocrystal) can include a core comprising a Group IV element or a compound represented by the formula MX, where M is cadmium, zinc, magnesium, mercury, aluminum, gallium, indium, thallium, or mixtures thereof, and X is oxygen, sulfur, selenium, tellurium, nitrogen, phosphorus, arsenic, antimony, or mixtures thereof. Examples of materials suitable for use as a core include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys. Examples of materials suitable for use as a shell include, but are not limited to, CdS, CdO, CdSe, CdTe, ZnS, ZnO, ZnSe, ZnTe, MgTe, GaAs, GaP, GaSb, GaN, HgS, HgO, HgSe, HgTe, InAs, InP, InSb, InN, AlAs, AlP, AlSb, AlS, PbS, PbO, PbSe, Ge, Si, alloys thereof, and/or mixtures thereof, including ternary and quaternary mixtures and/or alloys.

The surrounding "shell" material can be selected to have a bandgap greater than the bandgap of the core material and can be chosen so as to have an atomic spacing close to that of the "core" substrate.

The surrounding shell material can be selected to have a bandgap less than the bandgap of the core material.

The shell and core materials can have the same crystal structure.

Shell materials are discussed further below.

Quantum confined semiconductor nanoparticles can be members of a population of semiconductor nanoparticles having a narrow size distribution.

Quantum confined semiconductor nanoparticles (including, e.g., semiconductor nanocrystals) can comprise a monodisperse or substantially monodisperse population of nanoparticles.

Quantum confined semiconductor nanoparticles can show strong quantum confinement effects that can be harnessed in designing bottom-up chemical approaches to create optical properties that are tunable with the size and composition of the nanoparticles.

An example of a methods for the preparation and manipulation of semiconductor nanocrystals are described in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 entitled "Highly Luminescent Color-selective Materials" (which issued as U.S. Pat. No. 6,322,901 on 27 Nov. 2001) which are hereby incorporated herein by reference in their entireties. Other examples of the preparation and manipulation of semiconductor nanocrystals are described in U.S. Pat. Nos. 6,322,901 and 6,576,291, and U.S. Patent Application No. 60/550,314, each of which is hereby incorporated herein by reference in its entirety.

Quantum confined semiconductor nanoparticles (including, but not limited to, semiconductor nanocrystals) can typically include ligands attached to an outer surface.

Ligands can be derived from a coordinating solvent that can be used to help control the growth process. A coordinating solvent is a compound having a donor lone pair that, for example, has a lone electron pair available to coordinate to a surface of the growing nanocrystal. Solvent coordination can stabilize the growing nanocrystal.

A nanoparticle surface that includes ligands derived from the growth process can be modified by repeated exposure to an excess of a competing ligand group (including, e.g., but not limited to, coordinating group) to form an overlayer. For example, a dispersion of the capped quantum confined semiconductor nanoparticles (including, e.g., semiconductor nanocrystals) can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanoparticle, including, for example, but not limited to, phosphines, thiols, amines and phosphates.

For example, a nanocrystal or other nanoparticle can be exposed to short chain polymers which exhibit an affinity for the surface and which terminate in a moiety having an affinity for a suspension or dispersion medium. Such affinity improves the stability of the suspension and discourages flocculation of the nanoparticle.

For example, a coordinating ligand can have the formula:

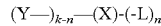
(Y—)$_{k-n}$—(X)-(-L)$_n$ wherein k is 2, 3 or 5, and n is 1, 2, 3, 4 or 5 such that k–n is not less than zero; X is O, S, S=O, SO2, Se, Se=O, N, N=O, P, P=O, As, or As=O; each of Y and L, independently, is aryl, heteroaryl, or a straight or branched C2-12 hydrocarbon chain optionally containing at least one double bond, at least one triple bond, or at least one double bond and one triple bond. The hydrocarbon chain can be optionally substituted with one or more C1-4 alkyl, C2-4 alkenyl, C2-4 alkynyl, C1-4 alkoxy, hydroxyl, halo, amino, nitro, cyano, C3-5 cycloalkyl, 3-5 membered heterocycloalkyl, aryl, heteroaryl, C1-4 alkylcarbonyloxy, C1-4 alkyloxycarbonyl, C1-4 alkylcarbonyl, or formyl. The hydrocarbon chain can also be optionally interrupted by —O—, —S—, —N(Ra)—, —N(Ra)—C(O)—O—, —O—C(O)—N(Ra)—, —N(Ra)—C(O)—N(Rb)—, —O—C(O)—O—, —P(Ra)—, or —P(O)(Ra)—. Each of Ra and Rb, independently, is hydrogen, alkyl, alkenyl, alkynyl, alkoxy, hydroxylalkyl, hydroxyl, or haloalkyl. An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyiridyl, pyrrolyl, phenanthryl.

Examples of additional ligands include alkyl phosphines, alkyl phosphine oxides, alkyl phosphonic acids, or alkyl phosphinic acids, pyridines, furans, and amines. More specific examples include, but are not limited to, pyridine, tri-n-octyl phosphine (TOP), tri-n-octyl phosphine oxide (TOPO) and tris-hydroxylpropylphosphine (tHPP). Technical grade TOPO can be used.

A suitable coordinating ligand can be purchased commercially or prepared by ordinary synthetic organic techniques, for example, as described in J. March, Advanced Organic Chemistry, which is incorporated herein by reference in its entirety.

See also U.S. patent application Ser. No. 10/641,292 entitled "Stabilized Semiconductor Nanocrystals", filed 15 Aug. 2003 (which issued as U.S. Pat. No. 7,160,613 on 9 Jan. 2007), which is hereby incorporated herein by reference in its entirety.

When a quantum confined semiconductor nanoparticle (including, but not limited to, a semiconductor nanocrystal) achieves an excited state (or in other words, an exciton is located on the nanocrystal), emission can occur at an emission wavelength. The emission has a frequency that corresponds to the band gap of the quantum confined semiconductor material. The band gap is a function of the size of the nanoparticle. Quantum confined semiconductor nanoparticle s having small diameters can have properties intermediate between molecular and bulk forms of matter. For example, quantum confined semiconductor nanoparticles having small diameters can exhibit quantum confinement of both the electron and hole in all three dimensions, which leads to an increase in the effective band gap of the material with decreasing crystallite size. Consequently, for example, both the optical absorption and emission of semiconductor nanocrystals shift to the blue, or to higher energies, as the size of the crystallites decreases.

The emission from a quantum confined semiconductor nanoparticle can be a narrow Gaussian emission band that can be tuned through the complete wavelength range of the ultraviolet, visible, or infra-red regions of the spectrum by varying the size of the quantum confined semiconductor nanoparticle, the composition of the quantum confined semiconductor nanoparticle, or both. For example, CdSe can be tuned in the visible region and InAs can be tuned in the infra-red region. The narrow size distribution of a population of quantum confined semiconductor nanoparticles can result in emission of light in a narrow spectral range. The population can be monodisperse preferably exhibits less than a 15% rms (root-mean-square) deviation in diameter of the quantum confined semiconductor nanoparticle s, more preferably less than 10%, most preferably less than 5%. Spectral emissions in a narrow range of no greater than about 75 nm, preferably 60 nm, more preferably 40 nm, and most preferably 30 nm full width at half max (FWHM) for quantum confined semiconductor nanoparticle s that emit in the visible can be observed. IR-emitting quantum confined semiconductor nanoparticle s can have a FWHM of no greater than 150 nm, or no greater than 100 nm. Expressed in terms of the energy of the emission, the emission can have a FWHM of no greater than 0.05 eV, or no greater than 0.03 eV. The breadth of the emission decreases as the dispersity of quantum confined semiconductor nanoparticle diameters decreases. A narrow FWHM of semiconductor nanocrystals can result in saturated color emission. A monodisperse population of semiconductor nanocrystals will emit light spanning a narrow range of wavelengths.

For example, semiconductor nanocrystals can have high emission quantum efficiencies such as greater than 10%, 20%, 30%, 40%, 50%, 60%, 70%, 80%, or 90%.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle diameter is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

Quantum confined semiconductor nanoparticles are typically handled in a controlled (oxygen-free and moisture-free) environment, preventing the quenching of luminescent efficiency during the fabrication process.

An optical material comprising quantum confined semiconductor nanoparticles can be dispersed in a liquid medium and are therefore compatible with thin-film deposition techniques such as spin-casting, drop-casting, and dip coating.

An ink including an optical material can be deposited onto a surface of a substrate by printing, screen-printing, spin-coating, gravure techniques, inkjet printing, roll printing, etc.

An ink can be deposited in a predetermined arrangement. For example, the ink can be deposited in a patterned or unpatterned arrangement. For additional information that may be useful to deposit an ink onto a substrate, see for example, International Patent Application No. PCT/US2007/014711, entitled "Methods For Depositing Nanomaterial, Methods For Fabricating A Device, And Methods For Fabricating An Array Of Devices", of Seth A. Coe-Sullivan, filed 25 Jun. 2007, which published as WO 2008/108798 on 12 Sep. 2008, the foregoing patent application being hereby incorporated herein by reference. A pattern that includes more than one size of semiconductor nanocrystal can emit light in more than one narrow range of wavelengths. The color of emitted light perceived by a viewer can be controlled by selecting appropriate combinations of semiconductor nanocrystal sizes and materials. The degeneracy of the band edge energy levels of semiconductor nanocrystals facilitates capture and radiative recombination of all possible excitons.

Due to the positioning of the optical material comprising quantum confined semiconductor nanoparticles in features or layers resulting from these deposition techniques, not all of the surfaces of the nanoparticles may be available to absorb and emit light.

In certain embodiments, an optical material comprising quantum confined semiconductor nanoparticles can be deposited on a surface using contact printing. See, for example, A. Kumar and G. Whitesides, *Applied Physics Letters*, 63, 2002-2004, (1993); and V. Santhanam and R. P. Andres, *Nano Letters*, 4, 41-44, (2004), each of which is incorporated by reference in its entirety. See also U.S. patent application Ser. No. 11/253,612, filed 20 Oct. 2005, entitled "Method And System For Transferring A Patterned Material", of Coe-Sullivan et al., which published as U.S. Publication No. 2006/0196375 A1 on 7 Sep. 2006, and U.S. patent application Ser. No. 11/253,595, filed 20 Oct. 2005, entitled "Light Emitting Device Including Semiconductor Nanocrystals," of Coe-Sullivan, which published as U.S. Publication No. 2008/0001167 A1 on 3 Jan. 2008, each of which is incorporated herein by reference in its entirety.

Such technique can be use for depositing a various thicknesses of optical materials comprising quantum confined semiconductor nanoparticles. The thickness can be selected to achieve the desired % absorption thereby. Preferably, the quantum confined semiconductor nanoparticles do not absorb any, or absorb only negligible amounts of, the re-emitted photons.

For certain applications, methods for applying a material (e.g., an optical material) to a predefined region on a substrate may be desirable. The predefined region is a region on the substrate where the material is selectively applied.

An optical material and/or an optical component can be designed to include two or more different types of quantum confined semiconductor nanoparticles. Different types of quantum confined semiconductor nanoparticle can optionally be included in two or more different optical materials. In such case, each of the different optical materials can be applied to different regions of a substrate or other area on which the nanoparticles are to be used. In such case, each of the different optical materials can be applied as separate layers. Such separate layers can be stacked on top of each other. The material and substrate can be chosen such that the material remains substantially entirely within the predetermined area. By selecting a predefined region that forms a pattern, material can be applied to the substrate such that the material forms a pattern. The pattern can be a regular pattern (such as an array, or a series of lines), or an irregular pattern. Once a pattern of material is formed on the substrate, the substrate can have a region including the material (the predefined region) and a region substantially free of material. In some circumstances, the material forms a monolayer on the substrate. The predefined region can be a discontinuous region. In other words, when the material is applied to the predefined region of the substrate, locations including the material can be separated by other locations that are substantially free of the material.

An optical material comprising quantum confined semiconductor nanoparticles can alternatively be deposited by solution based processing techniques, phase-separation, spin casting, inkjet printing, silk-screening, and other liquid film techniques available for forming patterns on a surface.

Alternatively, quantum confined semiconductor nanoparticles can be dispersed in a light-transmissive host material (e.g., a polymer, a resin, a silica glass, or a silica gel, etc., which is preferably at least partially light-transmissive, and more preferably transparent, to the light emitted by the quantum confined semiconductor nanoparticles and in which quantum confined semiconductor nanoparticles can be dispersed) that is deposited as a full or partial layer or in a patterned arrangement by any of the above-listed or other known techniques. Suitable materials include many inexpensive and commonly available materials, such as polystyrene, epoxy, polyimides, and silica glass. After application to the surface, such material may contain a dispersion of quantum confined semiconductor nanoparticles where the nanoparticles have been size selected so as to produce light of a given color. Other configurations of quantum confined semiconductor nanoparticles disposed in a material, such as, for example, a two-dimensional layer on a substrate with a polymer overcoating are also contemplated.

U.S. patent application Ser. No. 12/283,609 of Seth Coe-Sullivan et al. for "Compositions, Optical Component, System Including An Optical Components, Devices, And Other Products", filed 12 Sep. 2008, which issued as U.S. Pat. No. 8,718,437 on 6 May 2014, is hereby incorporated herein by reference in its entirety.

Optical materials and optical components described herein may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, a sign, lamps and various solid state lighting devices Other materials, techniques, methods, applications, and information that may be useful with the present invention are described in: U.S. Application No. 61/162,293, filed 21 Mar. 2009, U.S. Application No. 61/173,375 filed 28 Apr. 2009, U.S. Application No. 61/175,430 filed 4 May 2009, U.S. Patent Application No. 61/175,456, filed 4 May 2009, U.S. Patent Application No. 61/234,179, filed 14 Aug. 2009, International Patent Application No. PCT/US2009/002789, filed 6 May 2009 (which published as PCT Publication No. WO 2009/151515 on 17 Dec. 2009); and, U.S. patent application Ser. No. 12/283,609 of Seth Coe-Sullivan et al. for "Compositions, Optical Component, System Including An Optical Components, Devices, And Other Products", filed 12 Sep. 2008 (which issued as U.S. Pat. No. 8,718,437 on 6 May 2014), International Application No. PCT/US2009/002796 of Seth Coe-Sullivan et al. for "Optical Components, Systems Including an Optical Component, And Devices", filed 6 May 2009 (which published as PCT Publication No. WO 2009/137053 on 12 Nov. 2009), and U.S. Patent Application No. 61/252,656 of Breen for "Method For Preparing Quantum Dots", filed 17 Oct. 2009, U.S. Application No. 60/946,090 of Linton, et al., for "Methods For Depositing Nanomaterial, Methods For Fabricating A Device, Methods For Fabricating An Array Of Devices And Compositions", filed 25 Jun. 2007, and U.S. Application No. 60/949,306 of Linton, et al., for "Compositions, Methods For Depositing Nanomaterial, Methods For Fabricating A Device, And Methods For Fabricating An Array Of Devices", filed 12 Jul. 2007. Each of the foregoing is hereby incorporated by reference herein in its entirety.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

As used herein, "top", "bottom", "over", and "under" are relative positional terms, based upon a location from a reference point. More particularly, "top" means farthest away from a reference point, while "bottom" means closest to the reference point. Where, e.g., a layer is described as disposed or deposited "over" a component or substrate, the layer is disposed farther away from the component or substrate. There may be other layers between the layer and component or substrate. As used herein, "cover" is also a relative position term, based upon a location from a reference point. For example, where a first material is described as covering a second material, the first material is disposed over, but not necessarily in contact with the second material.

As used herein, the singular forms "a", "an" and "the" include plural unless the context clearly dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. An optical component including an optical material comprising light-emitting quantum confined semiconductor nanoparticles having a solution quantum yield of at least 70% prior to addition to the optical material, the quantum confined semiconductor nanoparticles being distributed in a solid light transmissive host material, the optical material having been exposed to light flux for a period of time sufficient to achieve a solid state photoluminescent efficiency of the optical material greater than or equal to about 70% when excited at a wavelength of 450 nm, the solid state photoluminescent efficiency being greater than or equal to the solution quantum yield of the nanoparticles prior to addition to the optical material.

2. An optical component in accordance with claim 1 wherein the optical material has solid state photoluminescent quantum efficiency greater than or equal to 80%.

3. An optical component in accordance with claim 1 wherein the optical material has solid state photoluminescent quantum efficiency greater than or equal to 90%.

4. An optical component in accordance with claim 1 wherein the optical material comprises up to about 30 weight percent quantum confined semiconductor nanoparticles based on the weight of the host material.

5. An optical component in accordance with claim 1 wherein the optical material further comprises light scatterers.

6. An optical component in accordance with claim 5 wherein the optical material comprises an amount of light scatterers in a range from 0.01 weight percent based on the weight of the host material up to an amount that is the same as the amount of quantum confined semiconductor nanoparticles included in the optical material.

7. An optical component in accordance with claim 1 wherein the optical material is at least partially encapsulated when exposed to the light flux.

8. An optical component in accordance with claim 7 wherein the optical material is at least partially encapsulated by barrier material that is oxygen impervious.

9. An optical component in accordance with claim 7 wherein the optical material is at least partially encapsulated by one or more barrier materials that are water impervious.

10. An optical component in accordance with claim 7 wherein the optical material is at least partially encapsulated by barrier material that is oxygen and water impervious.

11. An optical component in accordance with claim 7 wherein the optical material is at least partially encapsulated between opposing substrates.

12. An optical component in accordance with claim 11 wherein at least one of the substrates comprises barrier material that is oxygen and water impervious.

13. An optical component in accordance with claim 7 wherein the optical material is fully encapsulated after exposure to the light flux.

14. An optical component in accordance with claim 1 wherein the optical material is fully encapsulated when exposed to the light flux.

15. An optical component in accordance with claim 14 wherein the optical material is fully encapsulated by one or more barrier materials that are oxygen impervious.

16. An optical component in accordance with claim 14 wherein the optical material is fully encapsulated between opposing substrates that are sealed together by a seal, wherein each of the substrates and seal are oxygen impervious.

17. An optical component in accordance with claim 14 wherein the optical material is encapsulated between opposing substrates that are sealed together by a seal, wherein each of the substrates and seal are oxygen and water impervious.

18. An optical component in accordance with claim 14 wherein the optical material is encapsulated between glass plates that are sealed together by a barrier material.

19. An optical component in accordance with claim 14 wherein the optical material is encapsulated between glass plates that are sealed together by a glass-to-glass perimeter or edge seal.

20. An optical component in accordance with claim 14 wherein the optical material is encapsulated between glass plates that are sealed together by a glass-to-metal perimeter or edge seal.

21. An optical component in accordance with claim 14 wherein the optical material is disposed on a substrate and the optical material is covered by a coating comprising a barrier material.

22. An optical component in accordance with claim 21 wherein the barrier material comprises a material that is oxygen impervious.

23. An optical component in accordance with claim 21 wherein the barrier material comprises a material that is water impervious.

24. An optical component in accordance with claim 21 wherein the barrier material comprises a material that is oxygen and water impervious.

25. An optical component in accordance with claim 14 wherein the optical material is at least partially encapsulated by glass.

26. A device including an optical component in accordance with claim 1.

27. An optical component in accordance with claim 1 wherein the light flux comprises a peak wavelength in a range from about 365 nm to about 480 nm.

28. An optical component in accordance with claim 1 wherein the light flux comprises a peak wavelength in a range from about 450 nm to about 470 nm.

29. An optical component in accordance with claim 1 wherein the light flux is from about 10 to about 100 mW/cm$^2$.

30. An optical component in accordance with claim 1 wherein the quantum confined semiconductor nanoparticles comprise semiconductor nanocrystals.

31. An optical component in accordance with claim 30 wherein the semiconductor nanocrystals include a core comprising a first semiconductor material and a shell on at least a portion of the outer surface of the core, the shell comprising one or more layers, wherein each layer may comprise a semiconductor material that is the same or different from that included in each of any other layer.

32. An optical component in accordance with claim 1 wherein the host material comprises a polymer.

33. An optical component in accordance with claim 1 wherein the host material comprises a resin.

34. An optical component in accordance with claim 1 wherein the host material comprises a silicone.

35. An optical component in accordance with claim 1 wherein the host material comprises a glass.

* * * * *